United States Patent
Shima et al.

(10) Patent No.: US 8,735,945 B2
(45) Date of Patent: May 27, 2014

(54) SEMICONDUCTOR DEVICE

(75) Inventors: Masashi Shima, Yokohama (JP); Kaoru Saigoh, Yokohama (JP); Nobuhiro Misawa, Yokohama (JP); Takao Sasaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 251 days.

(21) Appl. No.: 13/225,285

(22) Filed: Sep. 2, 2011

(65) Prior Publication Data

US 2012/0132964 A1    May 31, 2012

(30) Foreign Application Priority Data

Nov. 30, 2010   (JP) ................. 2010-267403

(51) Int. Cl.
*H01L 29/66*   (2006.01)
*H01L 29/76*   (2006.01)

(52) U.S. Cl.
USPC ........... 257/211; 257/315; 257/316; 257/324; 257/E21.679; 257/E27.059; 257/E27.07; 257/E29.166

(58) Field of Classification Search
USPC ............... 257/211, 315, 316, 324, E21.679, 257/E27.059, E27.07, E29.166
See application file for complete search history.

(56) References Cited

U.S. PATENT DOCUMENTS

| | | |
|---|---|---|
| 5,945,730 A | 8/1999 | Sicard et al. |
| 6,020,613 A | 2/2000 | Udomoto et al. |
| 6,512,263 B1 * | 1/2003 | Yuan et al. .............. 257/316 |
| 6,674,120 B2 * | 1/2004 | Fujiwara ................. 257/324 |
| 2003/0071363 A1 | 4/2003 | Yoshida et al. |
| 2005/0035469 A1 | 2/2005 | Yoshida et al. |
| 2006/0255468 A1 | 11/2006 | Kim |
| 2008/0067554 A1 * | 3/2008 | Jeong et al. .............. 257/211 |
| 2008/0237736 A1 | 10/2008 | Sakurai et al. |
| 2009/0134432 A1 * | 5/2009 | Tabata et al. ............. 257/211 |

FOREIGN PATENT DOCUMENTS

| | | |
|---|---|---|
| CN | 101276815 A | 10/2008 |
| JP | 10-233509 A | 9/1998 |
| JP | 2001-352015 A | 12/2001 |
| JP | 2003-124390 A | 4/2003 |
| JP | 2004-273824 A | 9/2004 |
| JP | 2006-319338 A | 11/2006 |
| JP | 2008-042038 A | 2/2008 |
| JP | 2009-076614 A | 4/2009 |

OTHER PUBLICATIONS

Japanese Notification of Reason(s) for Refusal dated Jan. 28, 2014, issued in corresponding Japanese application No. 2010-267403, w/ English translation (3 pages).
Chinese Office Action dated Jan. 30, 2014, issued in Chinese Patent Application No. 201110333626.0 with English Translation. (15 pages).

* cited by examiner

*Primary Examiner* — Dao H Nguyen
(74) *Attorney, Agent, or Firm* — Westerman, Hattori, Daniels & Adrian, LLP

(57) ABSTRACT

A semiconductor device includes a transistor array including a plurality of transistors each having a gate electrode extended in a first direction, the plurality of transistors being arranged in a second direction intersecting the first direction, and a pad electrode arranged in the first direction of the transistor array and electrically connected to source regions of the plurality of transistors.

19 Claims, 24 Drawing Sheets

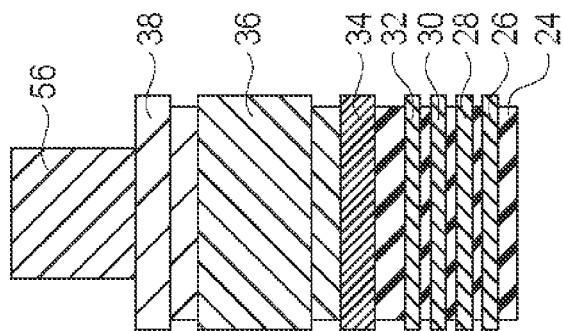
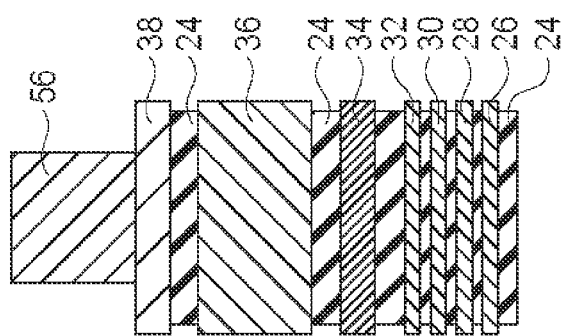
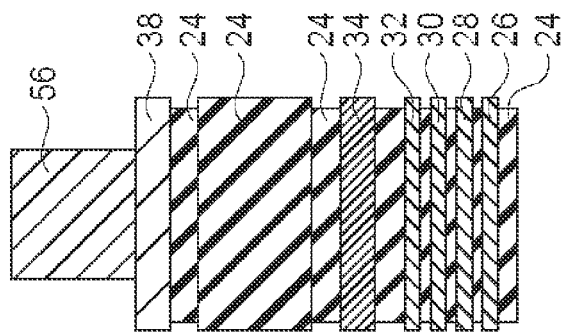

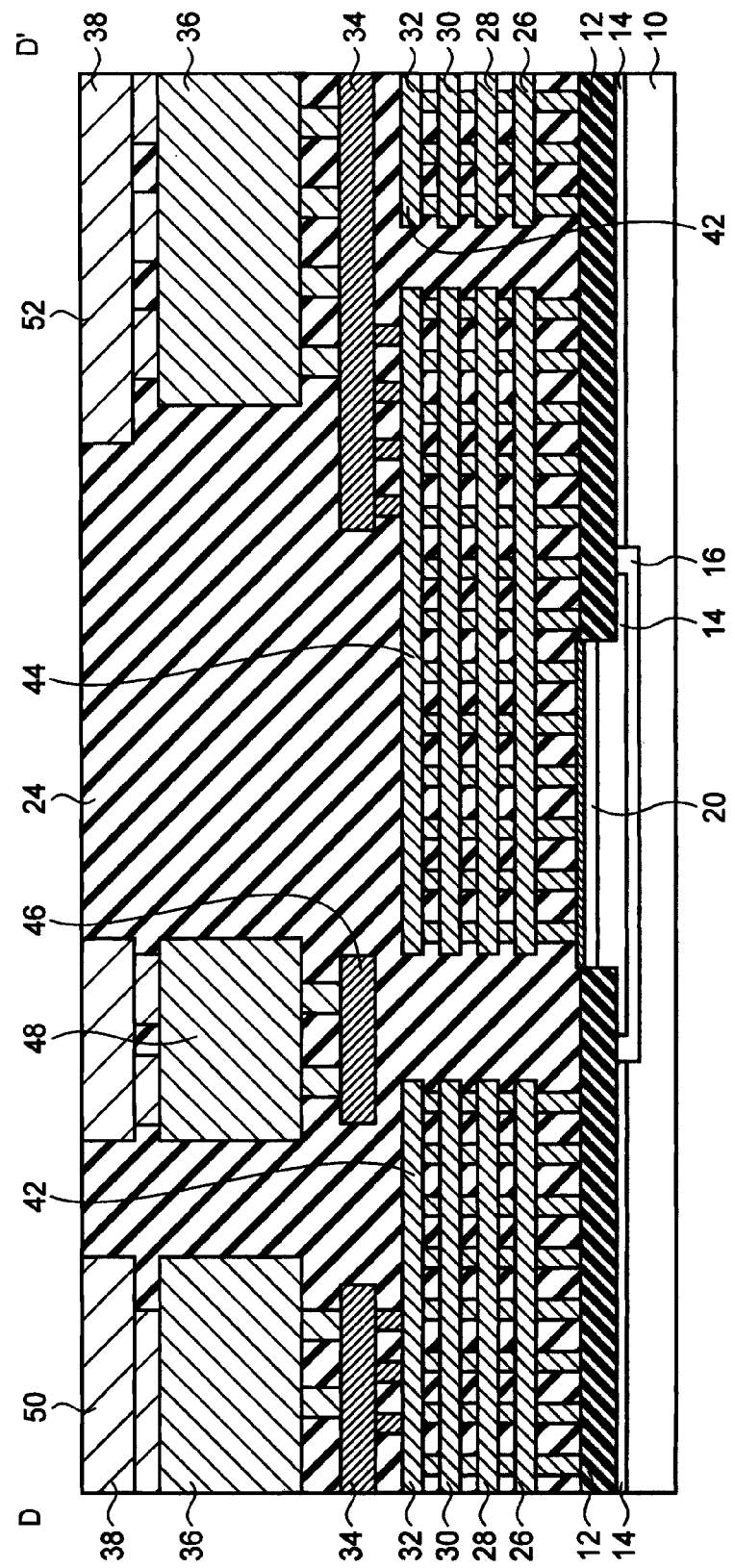

SEMICONDUCTOR DEVICE

CROSS REFERENCE TO RELATED APPLICATIONS

This application is based upon and claims the benefit of priority of the prior Japanese Patent Application No. 2010-267403, filed on Nov. 30, 2010, the entire contents of which are incorporated herein by reference.

FIELD

The embodiments discussed herein are related to a semiconductor device including a circuit element whose electric power consumption is large.

BACKGROUND

A semiconductor device including elements, such as a power amplifier circuit, etc., whose power consumption is large has large heating of the elements due to the operations. The temperature rise due to the operations is conspicuous especially in a semiconductor device having the packing density of the circuit elements increased for high density mount, radio-frequency characteristics improvement, etc.

When the internal temperature of the elements exceed the allowable temperature, the circuit characteristics, such as the high frequency characteristics, etc. are lowered, which is a cause for the breakage of the elements in the worst case. Accordingly, it is important in a semiconductor device including elements of large power consumption how to radiate the heat generated from the elements.

The following are examples of related: Japanese Laid-open Patent Publication No. 10-233509; Japanese Laid-open Patent Publication No. 2001-352015; Japanese Laid-open Patent Publication No. 2003-124390; Japanese Laid-open Patent Publication No. 2006-319338; and Japanese Laid-open Patent Publication No. 2009-076614.

For the high output semiconductor devices, such as power amplifiers, etc., the face up mount is used in many cases, and as a measure for the heat radiation is known a method of providing a heat radiation member, such as a heat radiation fin or others, on the backside of the substrate to thereby improve the heat radiation efficiency. However, the backside heat radiation type package is expensive. A semiconductor device which can be mounted at lower costs by, e.g., the flip chip mounting to improve the heat radiation efficiency to the circuit substrate on the side of the front side of the semiconductor substrate is expected.

SUMMARY

According to one aspect of an embodiment, there is provided a semiconductor device including a first transistor array including a plurality of transistors each having a gate electrode extended in a first direction, the plurality of transistors being arranged in a second direction intersecting the first direction, and a first pad electrode arranged in the first direction of the first transistor array and electrically connected to source regions of the plurality of transistors in the first transistor array.

According to another aspect of an embodiment, there is provided a semiconductor device including a plurality of pad electrodes arranged in a matrix in a first direction and a second direction intersecting the first direction, and a plurality of transistor arrays arranged respectively in the first direction of the plurality of pad electrodes and including a plurality of transistors each including a gate electrode extended in the first direction and a source region electrically connected to the adjacent pad electrode, the plurality of transistors being arranged in the second direction.

According to further another aspect of an embodiment, there is provided a semiconductor device including a transistor array including a plurality of transistors each having a gate electrode extended in a first direction, the plurality of transistors being arranged in a second direction intersecting the first direction, a pad electrode arranged in the first direction of the transistor array and electrically connected to source regions of the plurality of transistors, a drain line arranged on a side of the transistor array, which is different from a side of the transistor array where the pad electrode is provided, and electrically connected to drain regions of the plurality of transistors and extended in the second direction, a gate line arranged between the transistor array and the pad electrode, electrically connected to the gate electrodes of the plurality of transistors, and extended in the second direction, an input matching circuit connected to the gate line, and an output matching circuit connected to the drain line.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 20A-20C are diagrammatic sectional views illustrating structures of semiconductor devices used in the simulation of FIG. 19;

FIGS. 23 and 24 are diagrammatic sectional views illustrating the structure of the semiconductor device according to the second embodiment.

DESCRIPTION OF EMBODIMENTS

[A First Embodiment]

A semiconductor device according to a first embodiment will be described with reference to FIGS. 1 to 20C.

Figure 13A:
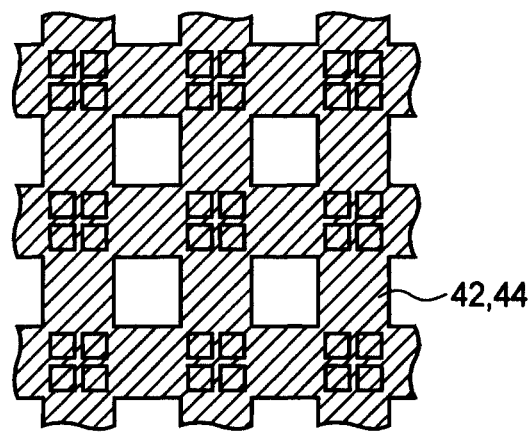
FIGS. 13A and 13B are plan views illustrating structures of the lead-out lines of the semiconductor device according to the first embodiment.
Figure 13B:
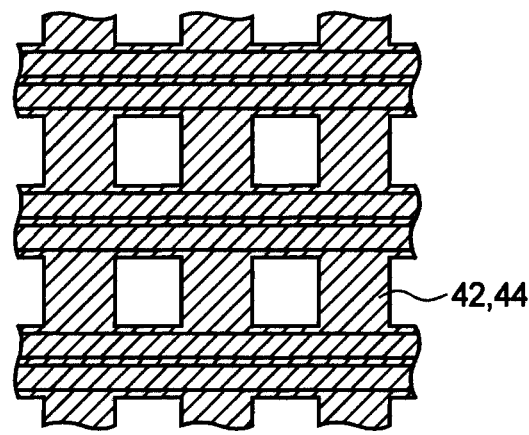
Figure 14:
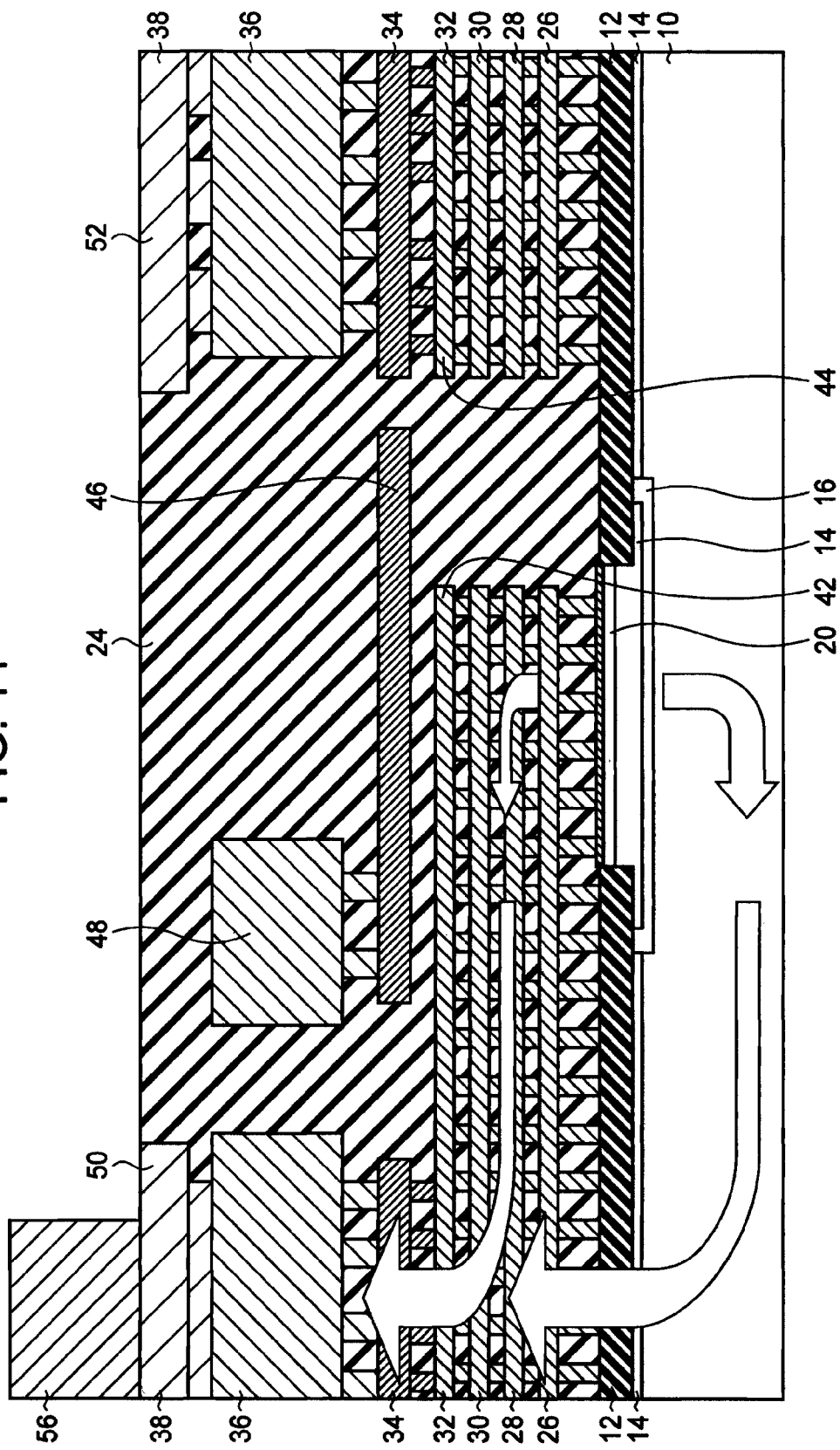
FIG. 14 is a diagrammatic sectional view illustrating the heat radiation paths of the semiconductor device according to the first embodiment.
Figure 15:
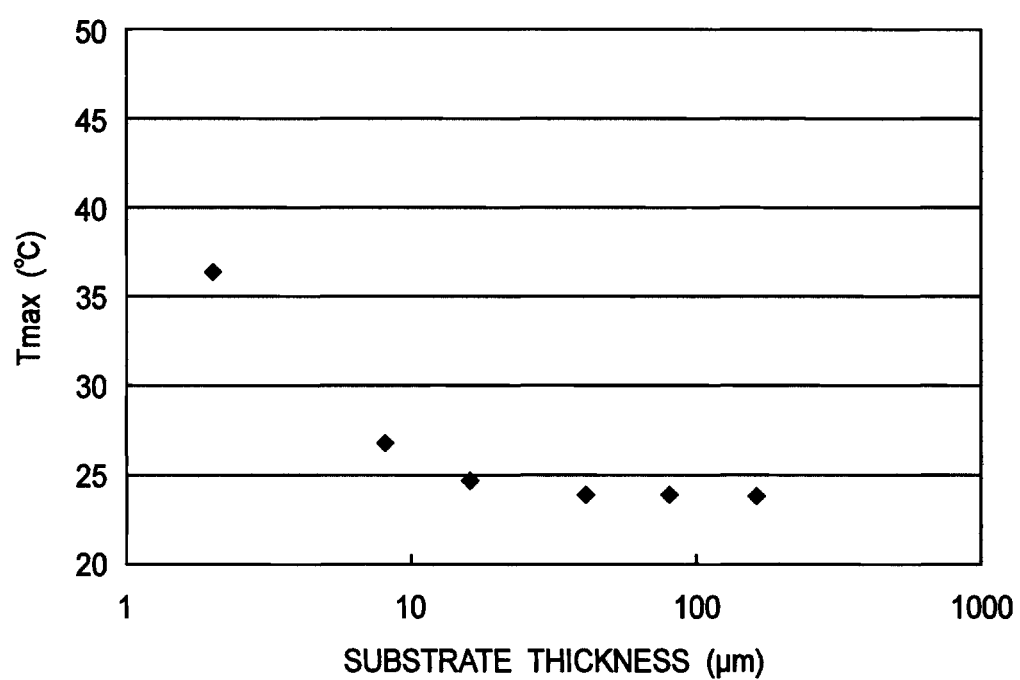
FIG. 15 is a graph illustrating the dependency of the heat radiation efficiency on the silicon substrate thickness given by simulation.
Figure 16:
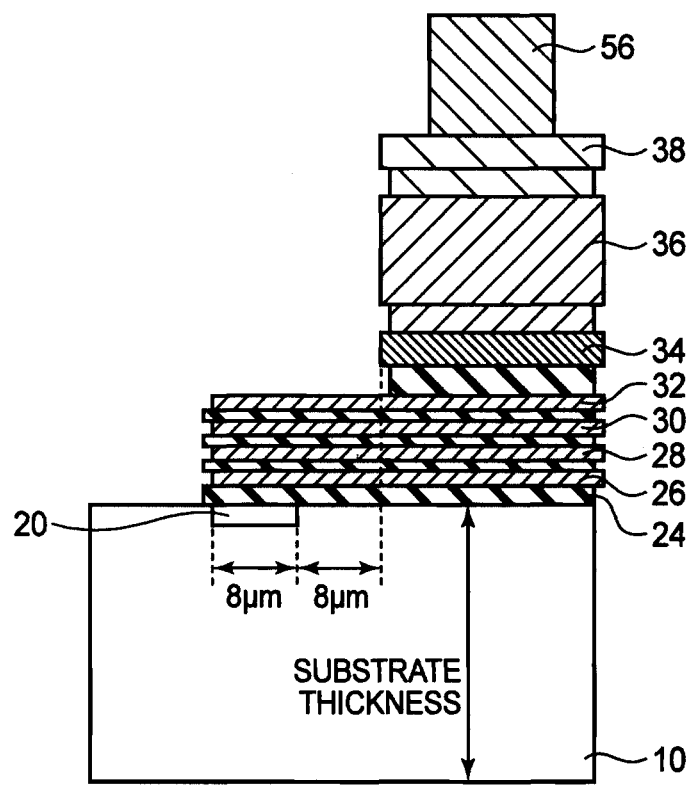
FIG. 16 is a diagrammatic sectional view illustrating a structure of a semiconductor device used in the simulation of FIGS. 15 and 17.
Figure 17:
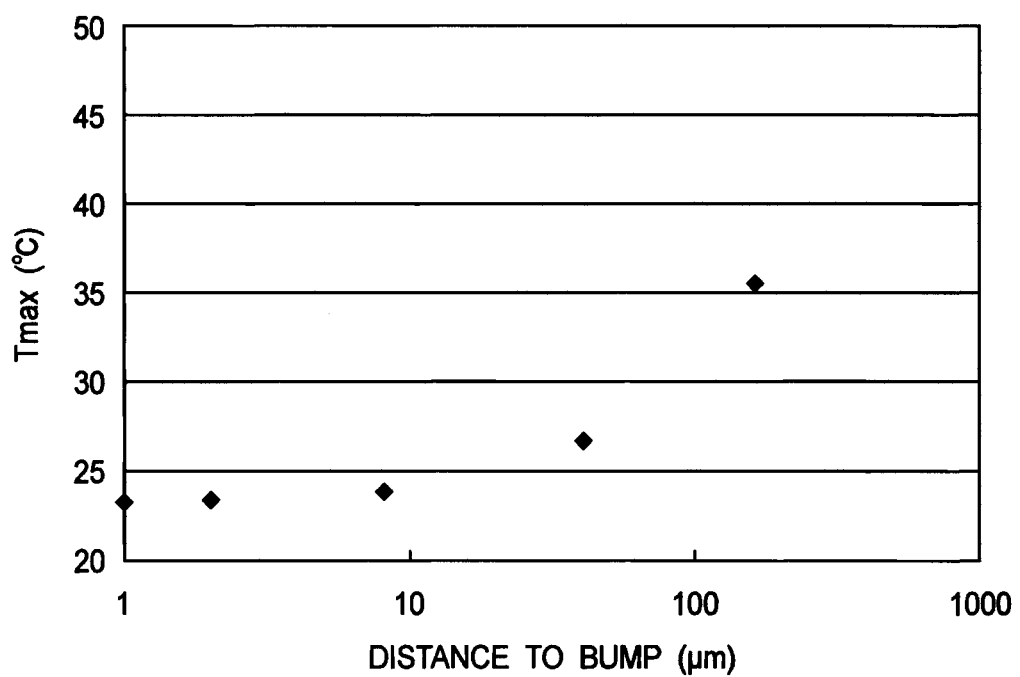
FIG. 17 is a graph illustrating the dependency of the heat radiation effect on the distance from the pad electrode given by simulation.
Figure 18:
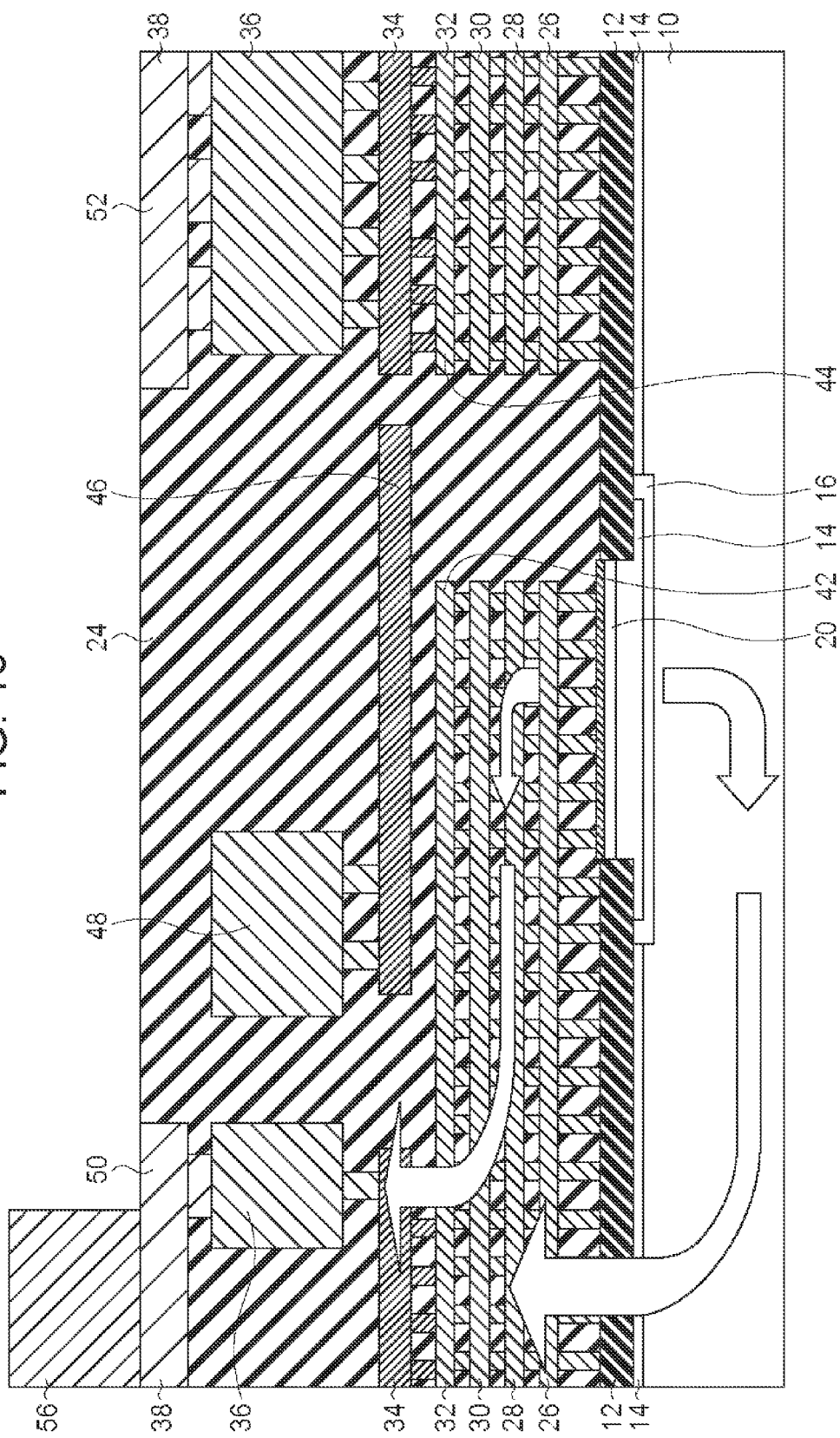
FIG. 18 is a diagrammatic sectional view illustrating a structure of a semiconductor device according to a modification of the first embodiment.
Figure 19:
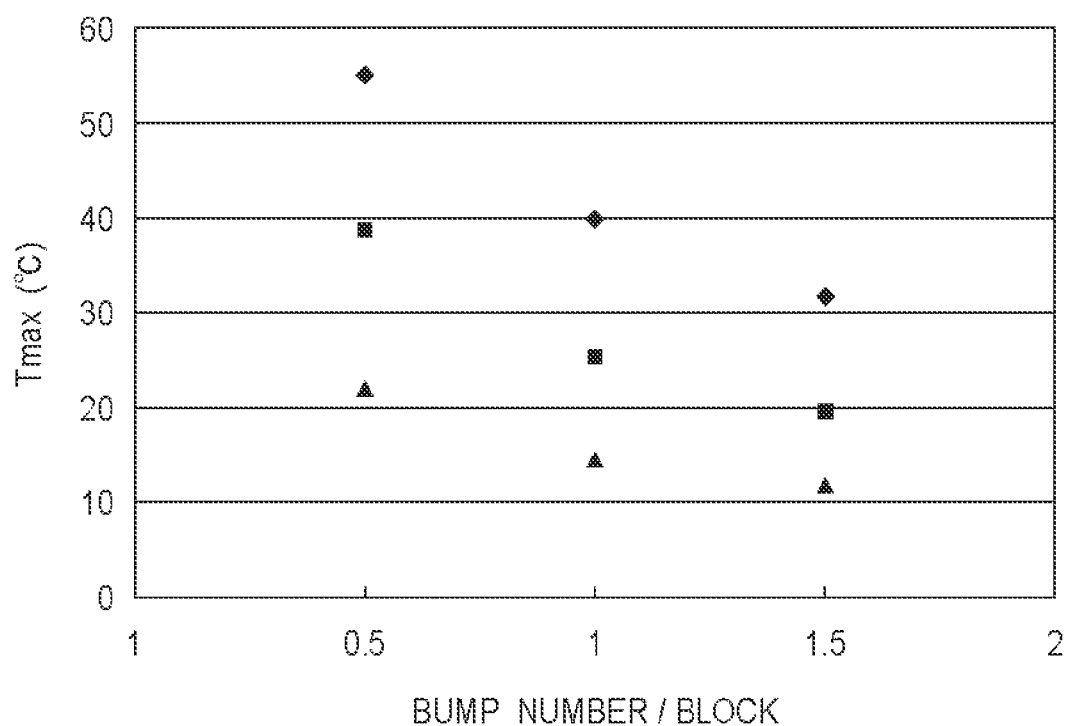
FIG. 19 is a graph illustrating the relationships between the heat radiation effect and the structure of the pad electrode below the bump given by simulation.

FIGS. 1-4 are plan views illustrating the structure of the semiconductor device according to the present embodiment. FIGS. 5-10 are diagrammatic sectional views illustrating the structure of the semiconductor device according to the present embodiment. FIGS. 11A-12B are sectional views and plan views illustrating structures of the semiconductor devices according to modifications of the present embodiment. FIGS. 13A and 13B are plan views illustrating structures of the lead-out lines of the semiconductor device according to the present embodiment. FIG. 14 is a diagrammatic sectional view illustrating the heat radiation paths of the semiconductor device according to the present embodiment. FIG. 15 is a graph illustrating the dependency of the heat radiation efficiency on the silicon substrate thickness given by simulation. FIG. 17 is a graph illustrating the dependency of the heat radiation effect on the distance from the pad electrode given by simulation. FIG. 16 is a diagrammatic sectional view illustrating a structure of a semiconductor device used in the simulation of FIGS. 15 and 17. FIG. 18 is a diagrammatic sectional view illustrating a structure of a semiconductor device according to a modification of the present embodiment. FIG. 19 is a graph illustrating the relationships between the heat radiation effect and the structure of the pad electrode below the bump given by simulation. FIGS. 20A-20C are diagrammatic sectional views illustrating structures of semiconductor devices used in the simulation of FIG. 19.

First, the structure of the semiconductor device according to the present embodiment will be described with reference to FIGS. 1 to 13B.

The semiconductor device according to the present embodiment is a semiconductor device including a circuit element of large power consumption, e.g., high voltage transistor of high output. For example, the semiconductor device according to the present embodiment is a semiconductor device including power amplifier circuits exemplified in FIGS. 1 and 2.

Figure 1:
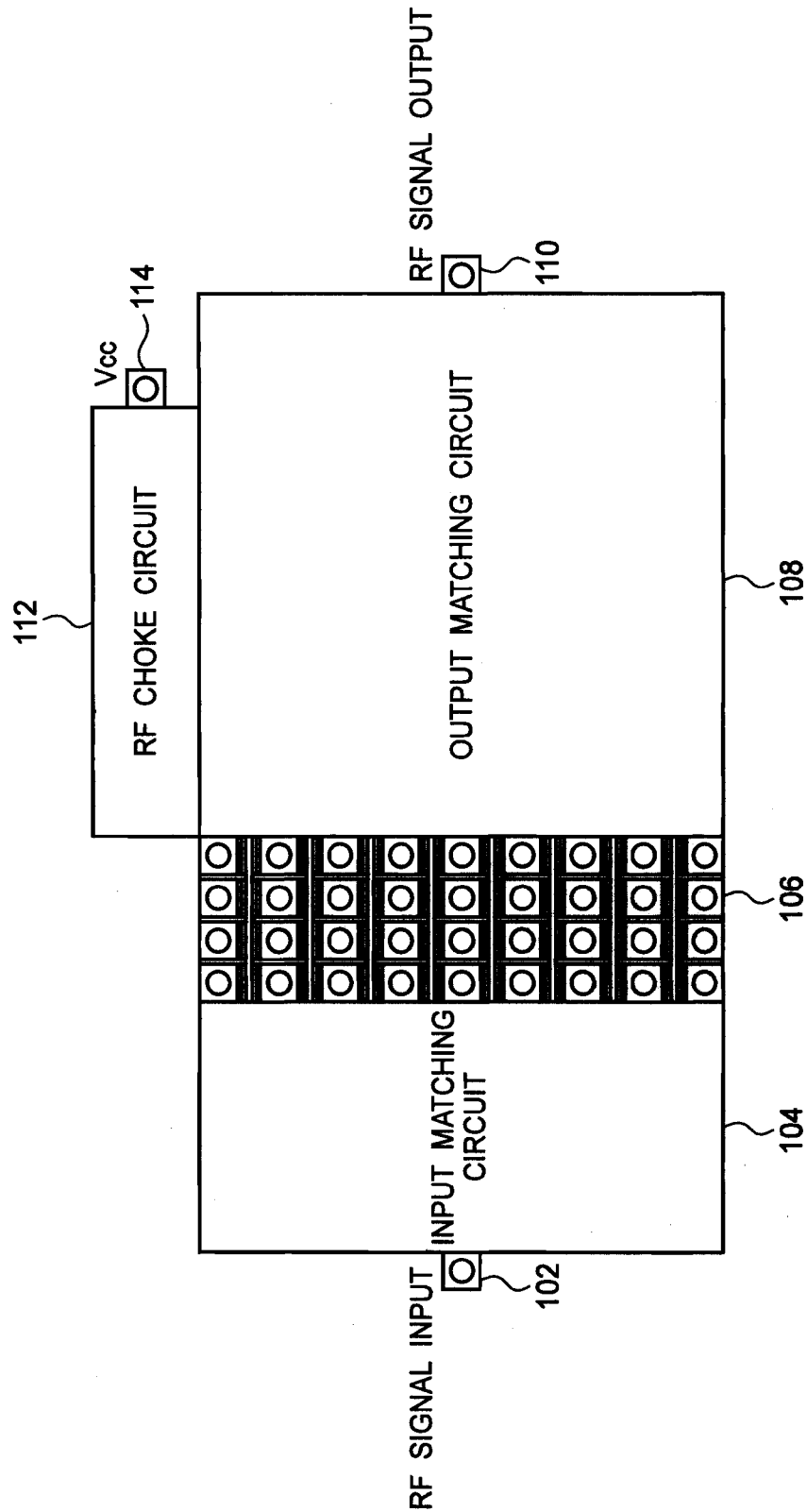
FIGS. 1-4 are plan views illustrating a structure of a semiconductor device according to a first embodiment.

FIG. 1 illustrates one example of the semiconductor device including a one-step power amplifier circuit. The semiconductor device illustrated in FIG. 1 amplifies an input signal inputted from a high frequency (also called as RF: radio frequency in the specification) signal input terminal 102 in a transistor integrated unit 106 and outputs the amplified signal from the high frequency signal output terminal 110. An input matching circuit 104 is provided between the high frequency signal input terminal 102 and the transistor integrated unit 106. An output matching circuit 108 is provided between the transistor integrated unit 106 and the high frequency signal output terminal 110. A Vcc terminal 114 is connected to the transistor integrated unit 106 via a high frequency choke circuit 112.

Figure 2:
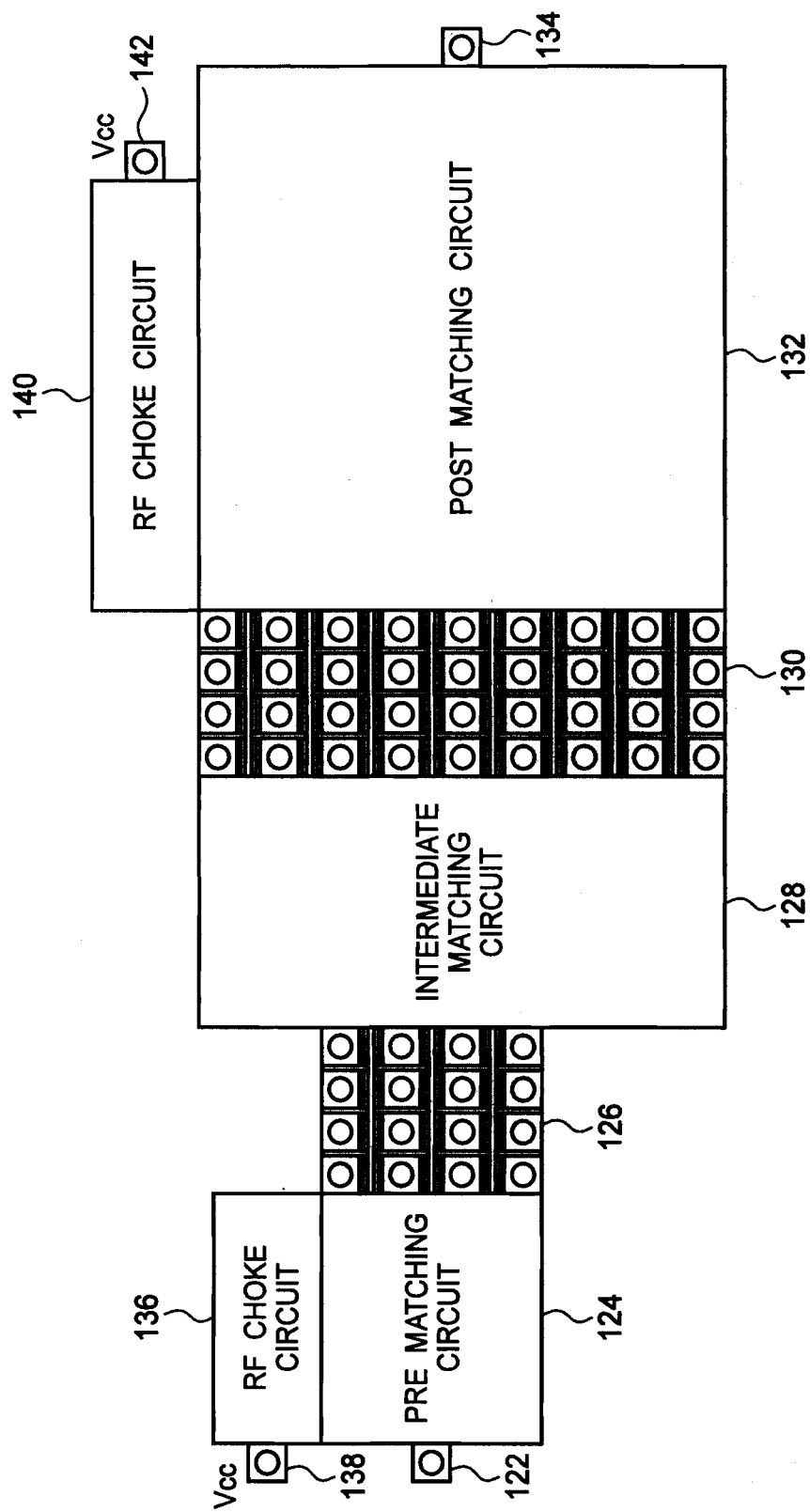

FIG. 2 illustrates one example of the semiconductor device including two-step power amplifier circuit. The semiconductor device illustrated in FIG. 2 amplifies a signal inputted from a high frequency signal input terminal 122 in a transistor integrated unit 126 and a transistor integrated unit 130 and outputs the amplified signal from a high frequency signal output terminal 134. A pre matching circuit 24 is provided between the high frequency signal input terminal 122 and the transistor integrated unit 136. An intermediate matching circuit 128 is provided between the transistor integrated unit 126 and the transistor integrated unit 130. The post matching circuit 132 is provided between the transistor integrated unit 130 and the high frequency signal output terminal 134. The transistor integrated unit 126 is connected to a Vcc terminal 138 via a high frequency choke circuit 136. The transistor integrated unit 130 is connected to a Vcc terminal 142 via a high frequency choke circuit 140.

The semiconductor device including such power amplifier circuits is used, although not specifically limited, as a power amplifier or others of transmission modules for portable telephones.

In such semiconductor device, high voltage transistors of high output are used in the transistor integrated units 106, 126, 130. For the high voltage transistors of high output, whose consumption power is high and whose heating value is large in operations, it is important to efficiently radiate heat generated in operations to thereby prevent the breakage of the elements and the degradation of the high frequency characteristics.

Then, the structure of the transistor integrated units 106, 126, 130 of the device according to the present embodiment will be specifically described. The structure will be described by means of the transistor integrated unit 106 of the semiconductor device illustrated in FIG. 1, but the transistor integrated units 126, 130 of the semiconductor device illustrated in FIG. 2 are the same.

Figure 3:
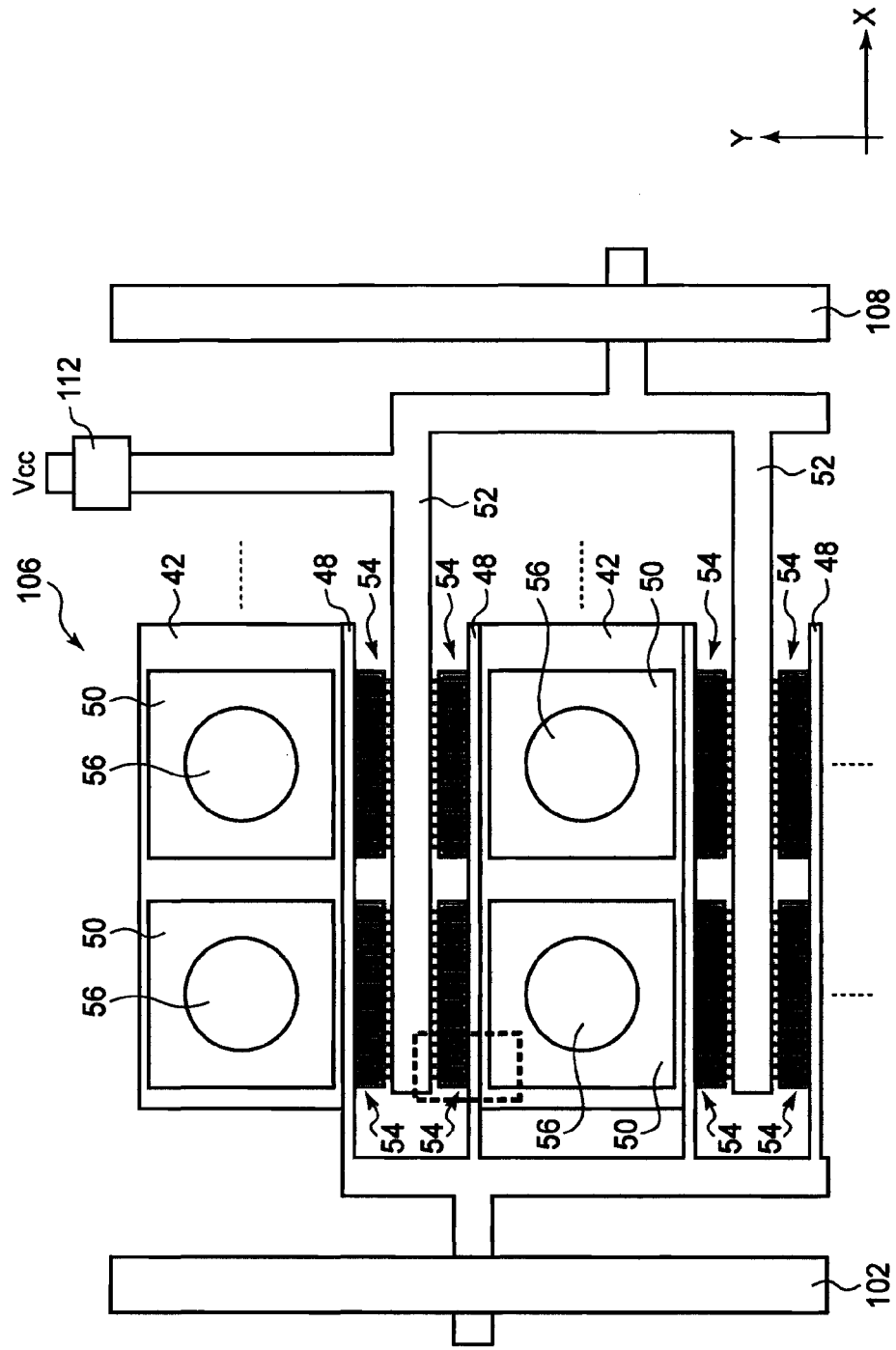

As illustrated in FIG. 3, pad electrodes 50 are arranged in the transistor integrated unit 106 in a matrix in the X direction and the Y direction. In the present specification, for the convenience of the description, the horizontal direction in FIG. 3 is defined as the X direction, and the vertical direction in FIG. 3 is defined as the Y direction. In the semiconductor device according to the present embodiment, the pad electrodes 50 function as ground electrodes and also as heat radiation paths for radiating heat generated in the transistors.

Drain lines 52 extended in the X direction are respectively provided in the regions between the pad electrodes 50 adjacent to each other in the Y direction. The line width of the drain lines 52 is, e.g., 12 µm although not specifically limited. Gate lines 48 extended in the X direction are respectively provided in the regions between the pad electrodes 50 and the drain lines 52. The line width of the gate lines 48 is, e.g., 4 µm although not specifically limited. Transistor array regions 54 are respectively provided in the regions between the gate lines 48 and the drain lines 52, corresponding to the respective pad electrodes 50.

As viewed with the drain lines 52 as the centers, the transistor array regions 54 and the pad electrodes 50 are laid out in line symmetry with the drain lines 52 as the symmetry axis.

The gate lines 48 may be laid out between the drain lines 52 and the pad electrodes 50, but for improving the high frequency characteristics, preferably, the gate lines 48 are laid out between the transistor array region 54 and the pad electrodes 50, spaced from the drain lines 52.

The respective gate lines 48 are connected to the input matching circuit 102. In the example of FIG. 3, plural gate lines 48 are gathered and connected to the input matching circuit 102.

The respective drain lines 52 are connected to the output matching circuit 106. In the example of FIG. 3, plural drain lines 52 are gathered and connected to the output matching circuit 108. The drain lines 52 are connected to the Vcc terminal 114 via the high frequency choking circuit 112.

Connection electrodes, such as bumps 56 or others, are formed above the pad electrodes 50. Thus, the semiconductor device is mounted on a circuit substrate or others via the bumps 56.

As described above, in the semiconductor device according to the present embodiment, a plurality of transistors of the transistor integrated unit 106 are sectioned and arranged in a plurality of the transistor array regions 54. The respective transistor array regions 54 are arranged adjacent to the regions where the pad electrodes 50, which function as the heat radiation paths, are formed.

Figure 4:
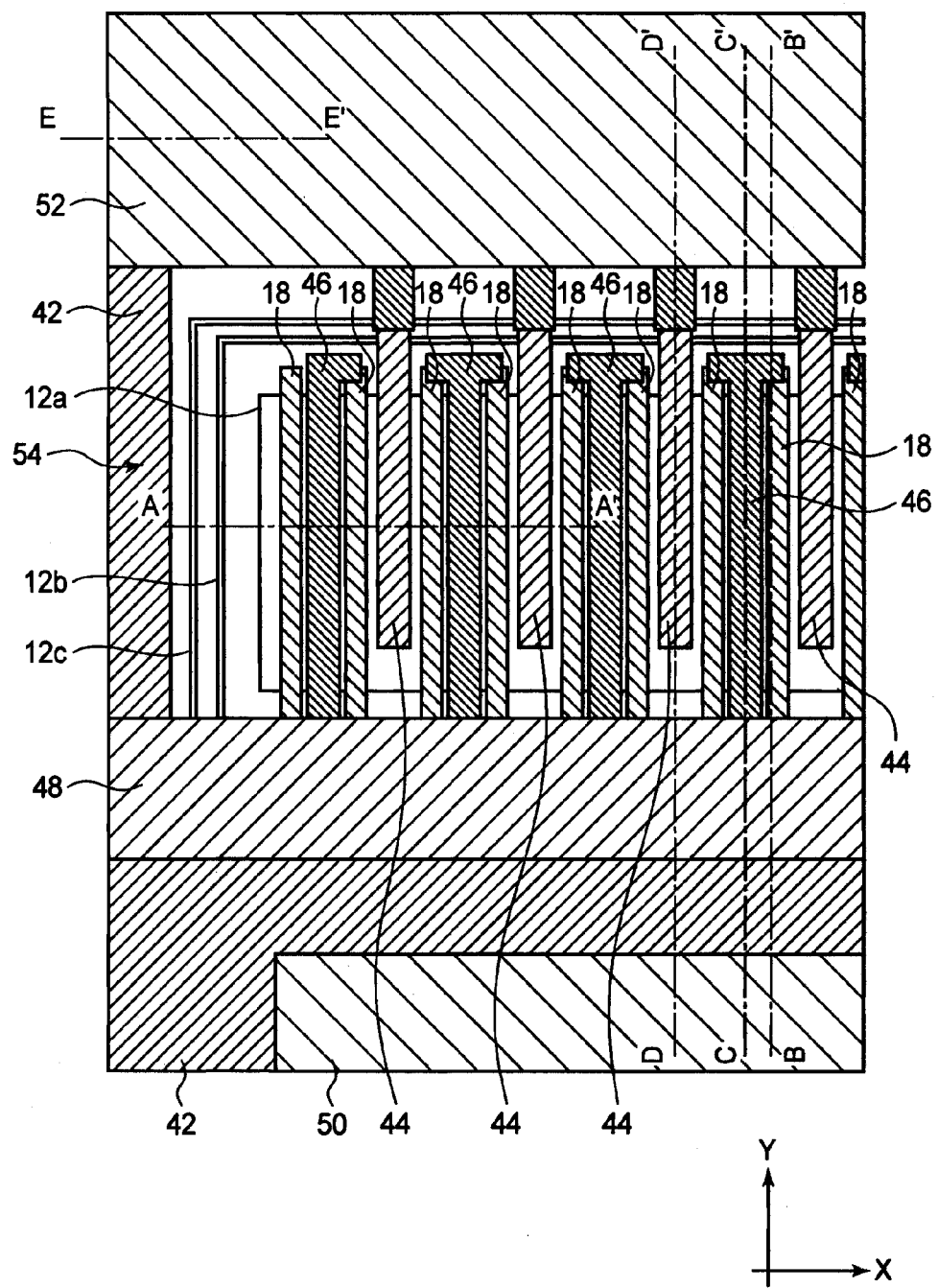
Figure 5:
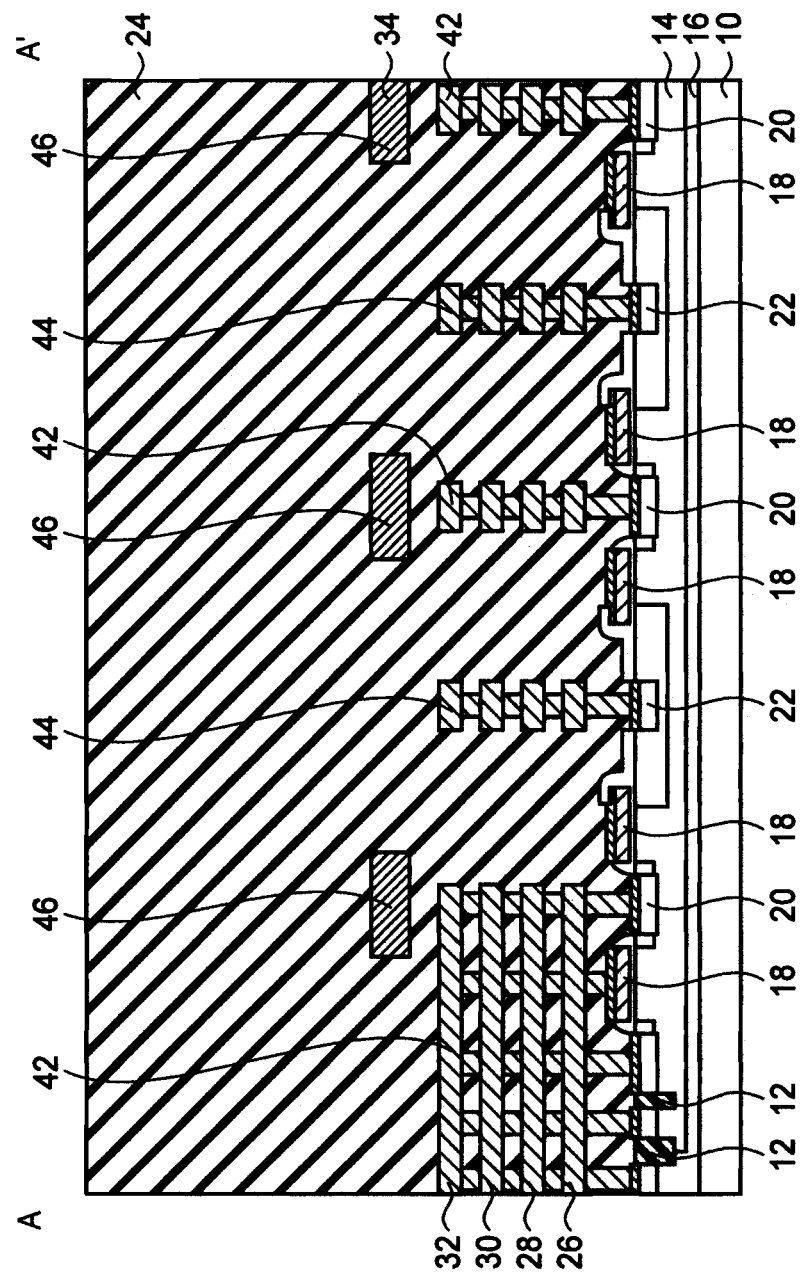
FIGS. 5-10 are diagrammatic sectional views illustrating the structure of the semiconductor device according to the first embodiment.
Figure 6:
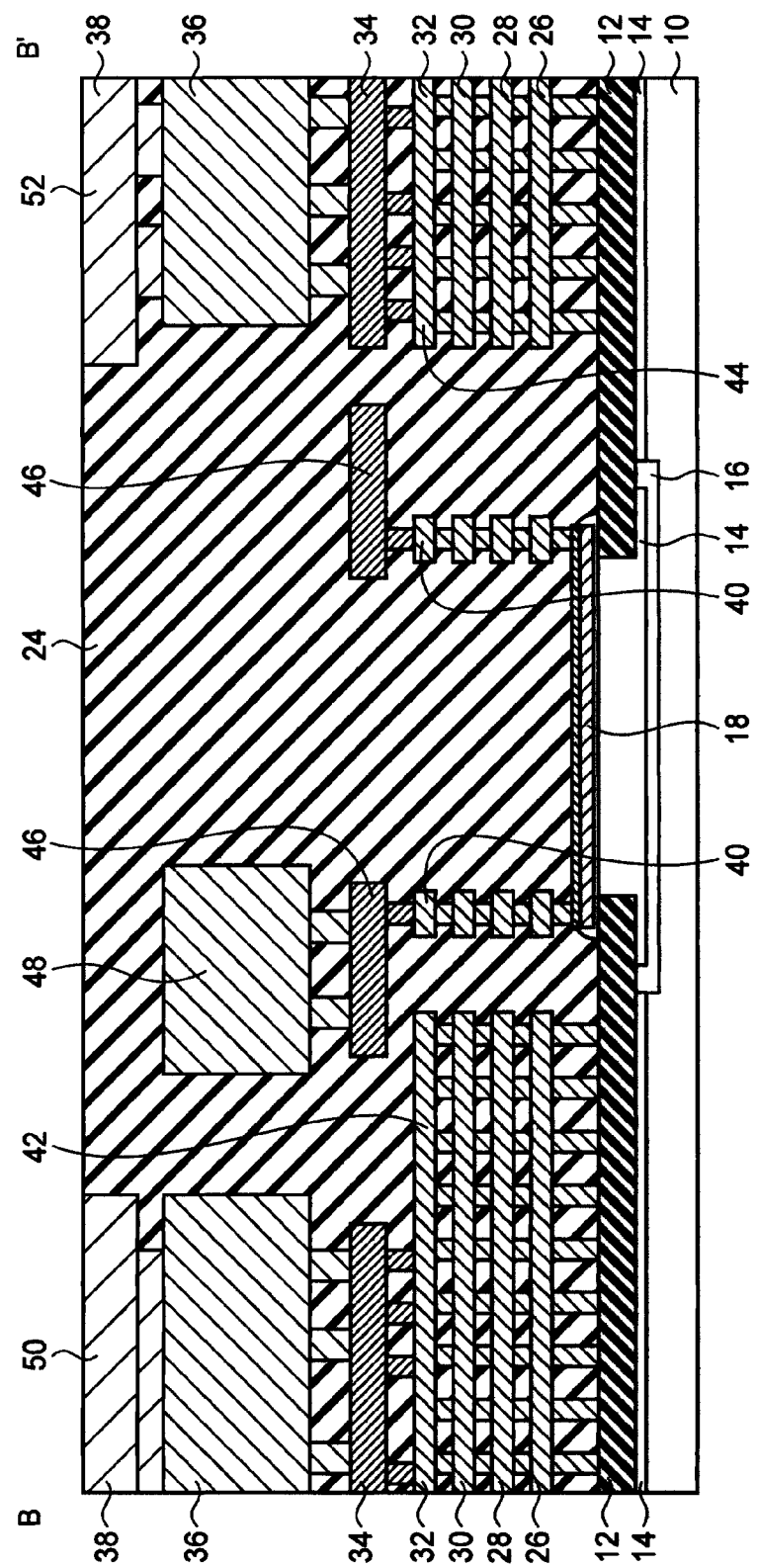
Figure 7:
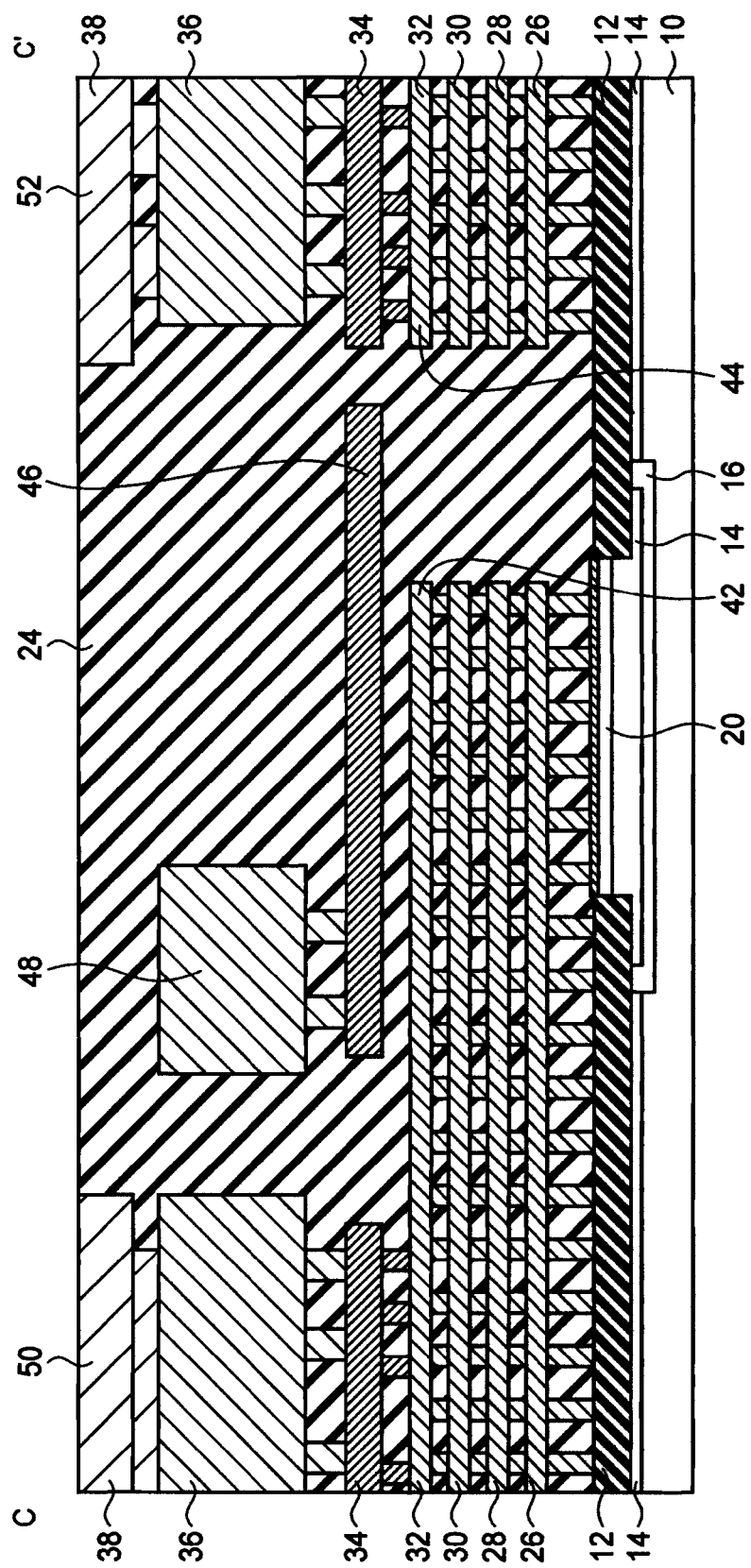
Figure 8:
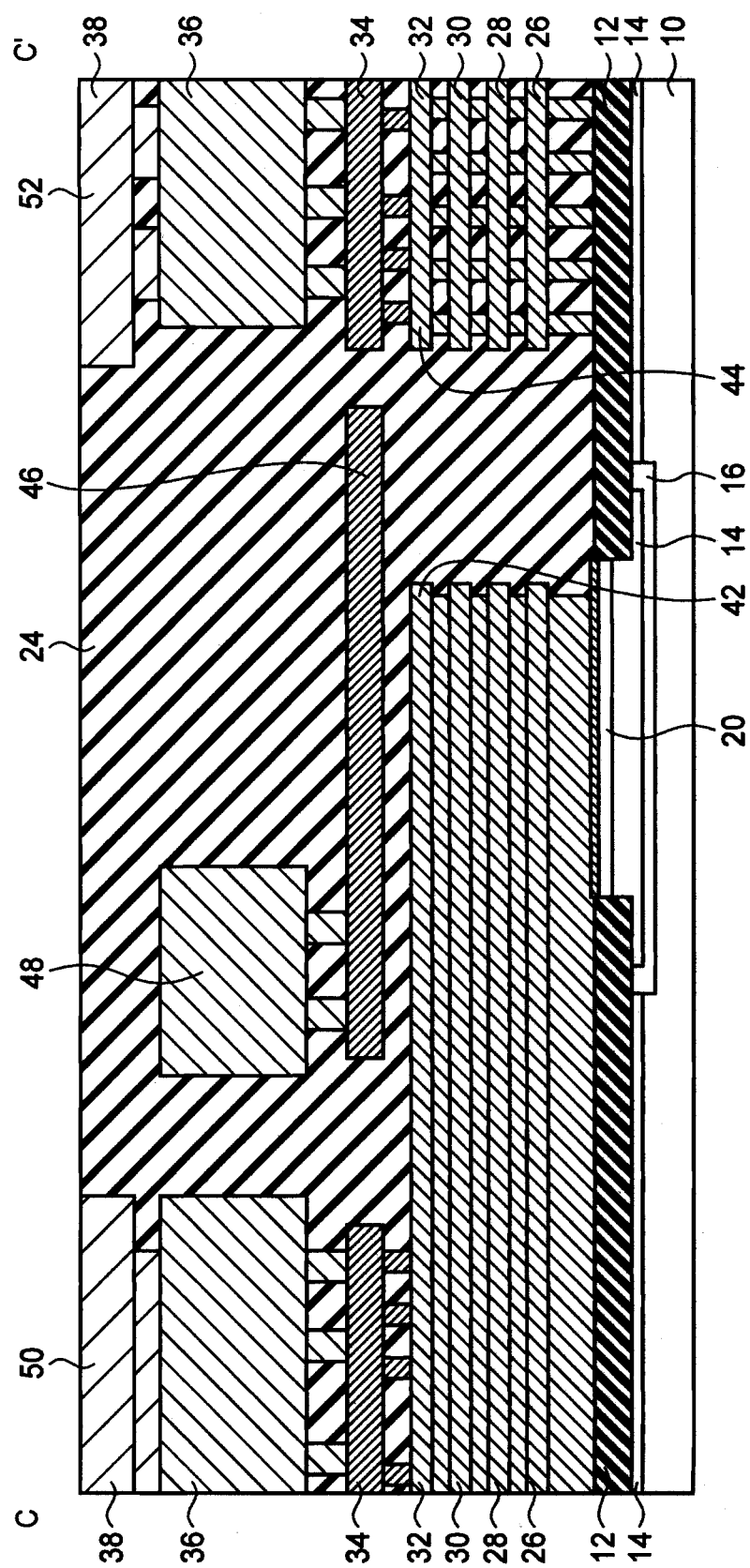
Figure 9:
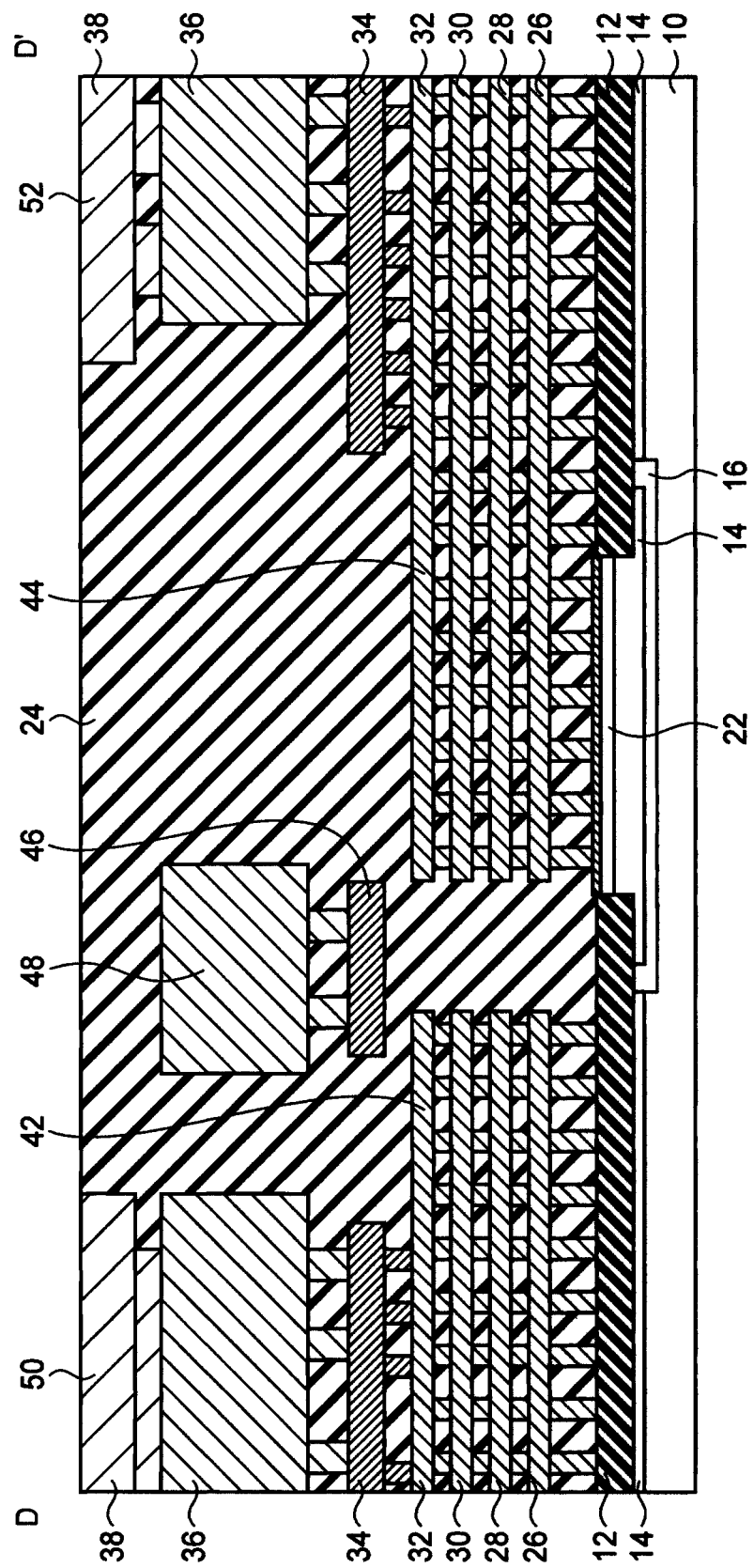
Figure 10:
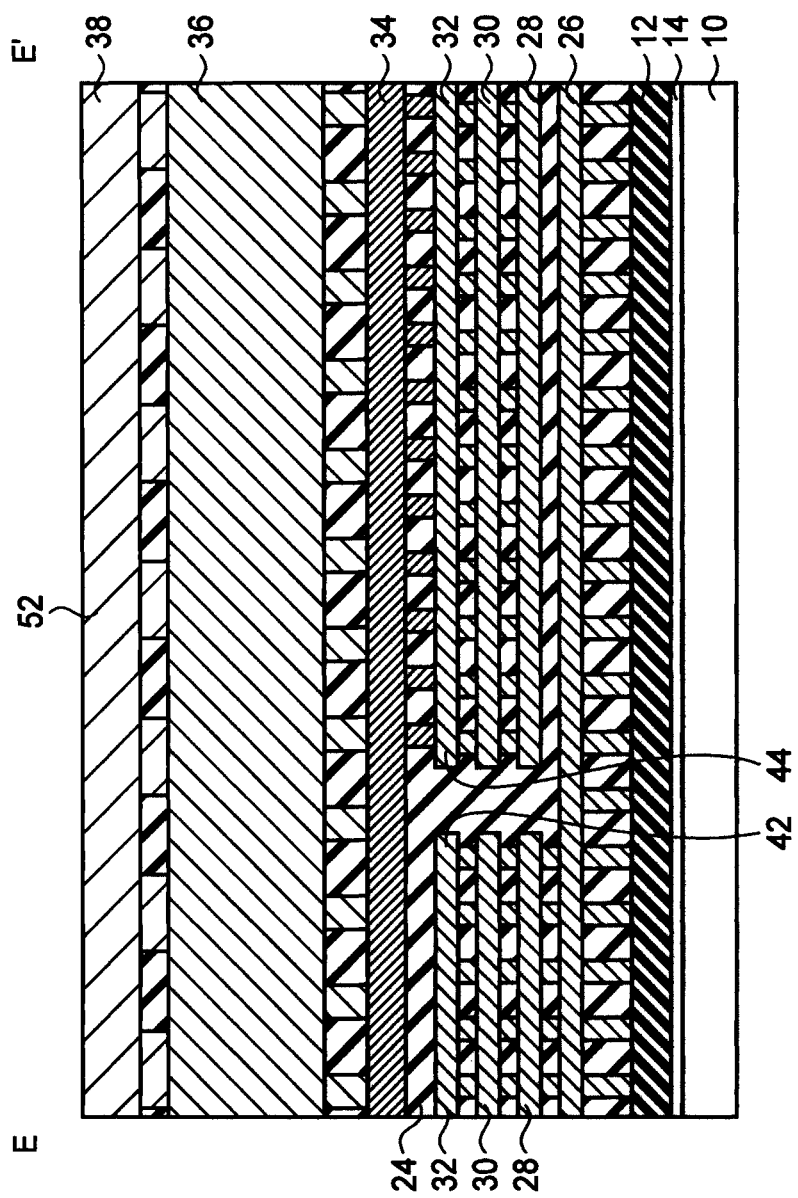
Figure 11A:
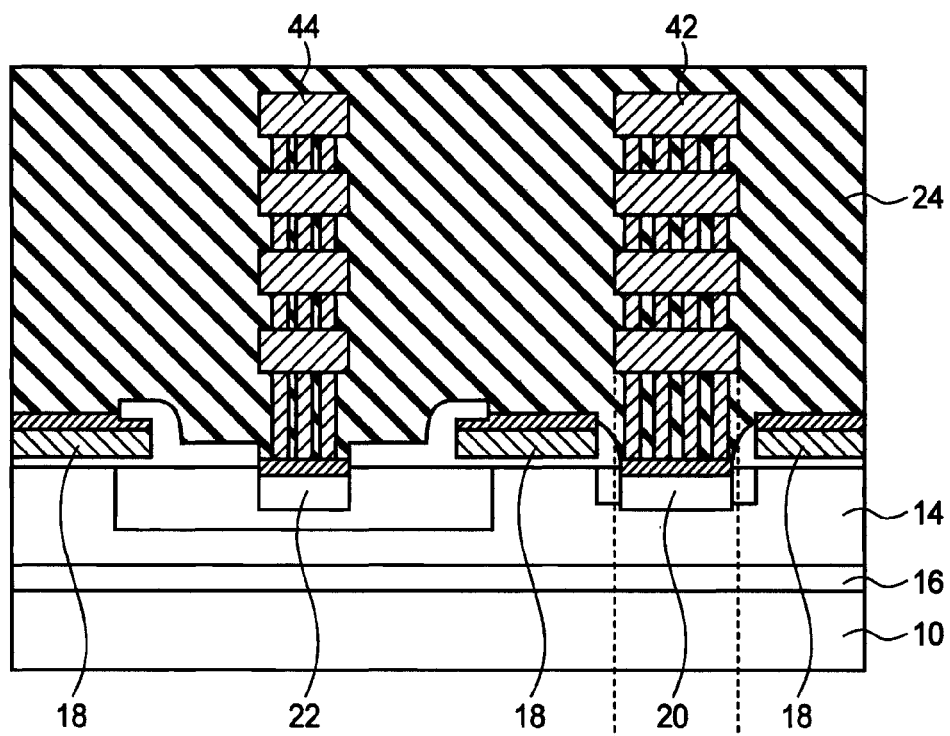
FIGS. 11A and 12A are sectional views illustrating structures of the semiconductor devices according to modifications of the first embodiment.
Figure 11B:
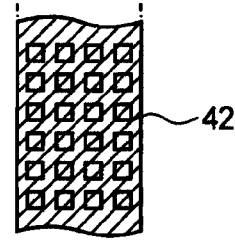
FIGS. 11B and 12B are plan views illustrating the structures of the semiconductor devices according to the modifications of the first embodiment.
Figure 12A:
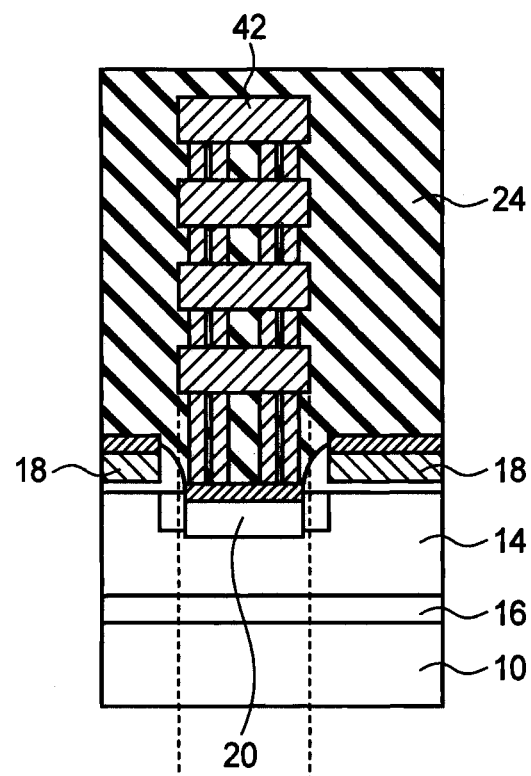
Figure 12B:
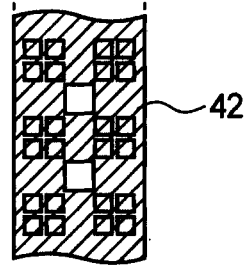

FIG. 4 is an enlarged view of the area enclosed by the dotted line in FIG. 3. FIG. 5 is the sectional view along the A-A' line in FIG. 4. FIG. 6 is the sectional view along the B-B' line in FIG. 4. FIGS. 7 and 8 are the sectional views along the C-C' line in FIG. 4. FIG. 9 is the sectional view along the D-D' line in FIG. 4. FIG. 10 is the sectional view along the E-E' line in FIG. 4.

In a silicon substrate 10, a device isolation insulating film 12 for defining active regions is formed. In the transistor array region 54 in the silicon substrate 10, a p-well 14, and an n-well 16 enclosing the sides and the bottom of the p-well 14 are formed. In the region where the p-well 14 is formed, an active region 12a where the transistor array is formed is defined by the device isolation insulating film 12. In the region at the peripheral edge of the p-well 14, an active region 12b which is the lead-out region of the electrodes from the p-well 14 is defined by the device isolation insulating film 12. In the region at the peripheral edge of the n-well 16, an active region 12c which is the lead-out region of the electrodes from the n-well 16 is defined by the device isolation insulating film 12.

In the active region 12a, a plurality of gate electrodes 18 extended in the Y direction are provided. In the silicon substrate 10 on both sides of each gate electrode 18, a source region 20 and a drain region 22 are respectively provided. The source regions 20 and the drain regions 22 are alternately formed in the active region 12a between the gate electrodes 18. The source regions 20 and the drain regions 22 of the transistors adjacent to each other are commonly used. Thus, in the active region 12a, a transistor array of a plurality of transistors including the gate electrodes 18 extended in the Y direction is formed.

As described above, in the semiconductor device according to the present embodiment, in each transistor array region 54, a plurality of the transistors are arranged in one row with one end of the gate electrodes 18 opposed to the pad electrode 50. In other words, with respect to the transistor array region 54, the pad electrode 50 is arranged along the extending direction or the gate width direction of the gate electrodes of the transistors.

Each transistor including the gate electrode 18, the source region 20 and the drain region 22 is a high voltage transistor of the offset drain structure as exemplified in FIG. 5, although not specifically limited. The size of the transistors is, although not specifically limited, a 0.4-0.5 μm gate length, a 1-2 μm inter-gate electrode 18 distance between the source regions 20, a 2-3 μm inter-gate electrode distance between the drain regions, and a 0.2 μm offset length of the drain regions. The gate width (the width along the Y direction of the active region 12a) is, e.g., 8 μm. In the structure 54 having the gate resistance decreased by strapping interconnections 46 of an about 0.9 μm-thickness and an about 0.4 μm-width, the maximum gate width which does not substantially degrade the high frequency characteristics is about 8 μm.

Above the silicon substrate 10 with the transistor arrays formed on, an inter-layer insulating film 24 is formed. In the inter-layer insulating film 24, a multilevel interconnection of a 7 level structure is buried. The first level interconnection layer 26 has, e.g., a 400 nm-via height and, e.g., a 250 nm-interconnection thickness. The second to the fourth level interconnection layers 28, 30, 32 have, e.g., a 300 nm-via height and, e.g., a 250 nm-interconnection thickness. The fifth level interconnection layer 34 has, e.g., a 600 nm-via height and, e.g., a 900 nm-interconnection thickness. The sixth level interconnection layer 36 has, e.g., a 650 nm-via height and, e.g., a 3300-nm interconnection thickness. The seventh level interconnection layer 38 has, e.g., an 800 nm-height and, e.g., a 1170 nm-interconnection thickness. The first to the sixth level interconnection layers 26, 28, 30, 32, 34, 36 may be formed of, e.g., copper interconnections, and the seventh level interconnection layer 38 may be formed of, e.g., an aluminum interconnection. Preferably, the sixth level interconnection layer 36 is formed of a thick copper interconnection as exemplified in FIGS. 5 to 9, for decreasing the interconnection resistance and the thermal resistance.

The first to the fourth level interconnection layers 26, 28, 30, 32, which are the lower interconnection layers, form the lead-out lines 40 from the gate electrodes 18, the lead-out lines 42 from the source regions 20 and the lead-out lines 44 from the drain regions 22 (see FIGS. 5 to 9). When the p-well 14 and the n-well 16 are fixed at the ground potential, as exemplified in FIG. 5, the lead-out lines 42 can function as the lead-out lines from the p-well 14 and the n-well 16.

The lead-out lines 42 are used also as one of the heat radiation paths from the transistors to the pad electrode 50. For this end, the lead-out lines 42 are led out from one side of the transistor array region 54 opposed to the pad electrode 50 and are extended to the region where the pad electrode 50 is formed (see FIGS. 7 and 8).

In the semiconductor device according to the present embodiment, the pad electrodes 50 are arrange adjacent to each transistor array region 54 (see FIG. 3). The transistors are laid out with one ends of the gate electrodes 18 opposed to the pad electrode 50 (see FIG. 4). This facilitates the lead-out of the lead-out lines 42 from the source regions 20 toward the pad electrode 50.

The lead-out lines 42 are one of the important paths of the heat generated from the transistors to the pad electrode 50. To this end, it is preferable that the lead-out lines 42 are formed in a region as wide as possible to decrease the heat resistance. In view of this, preferably, the lead-out lines 42 are formed all over the region where the pad electrode 50 is formed. Preferably, the lead-out lines 42 are formed enclosing the transistor array region 54. In the region where the drain line 52 is provided, as exemplified in FIG. 10, a part of the interconnection layers 26, 28, 30, 32 may be used as the lead-out line 42, and the rest lines may be used as the lead-out line 44.

In FIG. 5, the lead-out lines 42, 44 are connected to the upper level interconnection layer from the source regions 20 and the drain regions 22 respectively through vias, but the lead-out lines 42 and the lead-out lines 44 may be connected via a plurality of vias arranged in the Y direction. The number of the via arranged in the X direction may not be essentially one and, as exemplified in FIGS. 11A and 11B, may be connected via plural columns of via. As exemplified in FIGS. 12A and 12B, the lead-out lines 42 and the lead-out lines 44 may be connected via plural columns of via while the interconnection layers 26, 28, 30, 32 of the lead-out lines 42, 44 may be formed in a mesh.

As exemplified in FIG. 8, the via connected to the source region 20 may be a trench-shaped via extended in the Y direction. In this case as well, as in FIGS. 10 and 11, a plurality of the trenched-shaped vias may be laid out side by side. The respective layers of the lead-out lines 42, 44 may be arranged in a mesh. This can decrease the heat resistance in transferring heat generated from the transistors in the Y direction. The trench-shaped vias connected to the source regions 22 can be applied to the vias connected to the drain regions 22.

To the respective interconnection layers 26, 28, 30, 32 of the lead-out lines 42, 44 of the part extended on the device isolation insulating film 12, the mesh-shaped pattern as exemplified in FIG. 13A can be applied. When the trench-shaped vias illustrated in FIG. 8 are used, the mesh-shaped pattern as exemplified in FIG. 13B can be applied.

In the semiconductor device according to the present embodiment, as illustrated in FIG. 5, the lead-out line 42 is formed, connected to the gate electrode 18 positioned at the outermost part (left in the drawing) of the transistor array, and the diffused regions on both sides of the gate electrode 18. This is in consideration of the case that the outermost gate electrode 18 is used as a dummy. The gate electrodes 18 positioned on both sides of the transistor array often cannot be formed in a prescribed size due to processing fluctuations. In the present embodiment, the gate electrodes 18 as dummies are arranged on both sides of the transistor array, and the gate electrodes 18 and the diffused regions on both sides thereof are connected by the lead-out line 42 so that the gate electrodes 18 and the diffused regions cannot function as transistors. When processing fluctuations causes no problem, it is not necessary to provide the dummy transistors.

The strapping interconnections 46 of the gate electrodes 18 connected to the lead-out lines 40 are formed of the fifth level interconnection layer 34, which is the first upper interconnection layer. The strapping interconnection 46 are formed on the respective source regions 20, extended in the Y direction and connected to both ends of 2 gate electrodes 18 positioned on both sides of the associated source region 20 by the lead-out line 40 (see FIGS. 6 to 8). The strapping interconnection 46 are provided for decreasing the resistance of the gate electrodes 18 to improve the high frequency characteristics. The line width of the strapping interconnection 46 is not specifically limited but is, e.g., 0.4-0.5 µm.

The sixth level interconnection layer 36, which is the second upper interconnection layer, forms the gate line 48 connected to the strapping interconnection 46 (see FIGS. 5 to 8). The gate line 48 is formed of the upper interconnection layer 36, which is different from the lead-out lines 40, 42, 44 formed of the lower interconnection layers, whereby the gate line 48 can be arranged, superposed in the region where the lead-out lines 42, 44 are formed. The gate line 48 is formed of the thick interconnection layer 36, whereby the gate line 48 can be less resistive to decrease the RF signal loss.

The pad electrodes 50 connected to the lead-out lines 42 and the drain lines 52 connected to the lead-out lines 44 are formed of the fifth level interconnection layer 34, the sixth level interconnection layer 36, and the seventh level interconnection layer 38, which is the uppermost interconnection layer (see FIGS. 5 to 9). The drain line 52 is formed of the interconnection layer including the thick interconnection layer 36 and the interconnection layer 38, whereby the drain line 52 can be less resistive to decrease the RF signal loss.

As described above, in the semiconductor device according to the present embodiment, a plurality of transistors in the transistor integrated unit 106 are sectioned in plural transistor array regions 54. Each transistor array region 54 is positioned adjacent to the region where the pad electrode 50 functioning as the heat radiation path is formed. In the transistor array region 54, plural transistors are arranged in one row with one ends of the gate electrodes 18 opposed to the pad electrodes 50. This can shorten the distance between the transistors and the pad electrodes 50 and can make the same distance to the pad electrodes 50 among the respective transistors. Accordingly, the temperature distribution in the transistor array regions 54 can be made small and can increase the heat radiation efficiency from the pad electrodes 50.

Next, the heat radiation effect of the semiconductor device according to the present embodiment will be described with reference to FIGS. 14 to 20C.

As main heat radiation paths for the heat generated from the transistors to transfer to the pad electrodes 50, two routes as exemplified in FIG. 14 are considered. A first path is the path from the source regions 20 to the pad electrodes 50 via the lead-out lines 42. A second path is from the source regions 20 to the pad electrodes 50 via the silicon substrate 10, the device isolation insulating film and the lead-out lines 42.

First, which of these paths is dominant will be examined.

FIG. 15 is a graph illustrating the result of the silicon substrate thickness dependency of the heat radiation effect given by simulation. On the vertical axis, the temperature difference Tmax based on the bump 56 is taken, and the thickness of the silicon substrate is taken on the horizontal axis.

In the simulation, the structure from the source region 20 to the bump 56 is used, and the structure illustrated in FIG. 16 was simulated. The gate width of the transistor was set at 8 µm, and the distance from the transistor to the region where the pad electrode 50 was formed was set at 8 µm. The thicknesses of the respective interconnection layers were set at the same values as described above.

As illustrated in FIG. 15, the temperature difference Tmax decreases as the film thickness of the silicon substrate increases up to about 40 µm and becomes substantially constant as the thickness is larger than about 40 µm. This means that the region of the silicon substrate, which is about 40 µm from the surface effectively contributes to the heat radiation.

The heat conductivity of silicon is about 168 [W/m/K] and is about 0.0672 [W/K] for a 40 µm-thickness. On the other hand, the heat conductivity of copper, which forms the interconnection layers 26, 28, 30, 32, is about 398 [W/m/K], and the heat conductivity is about 0.00092 [W/K] for the 2.3 µm-total film thickness of the interconnection layers 26, 28, 30, 32 (including the via). Accordingly, it is seen that to the region below the pad electrode 50, the silicon substrate 10 is the main heat radiation path, and the lead-out electrode 42 is the assistant path.

FIG. 17 is a graph illustrating the dependency of the heat radiation effect on the distance from the pad electrode given by simulation. On the vertical axis, the temperature difference Tmax of the transistor array region 54 based on the bump 56, and the distance to the pad electrode 50 is taken on the horizontal axis. The distance between the transistor and the pad electrode 50 is a distance as view in plane.

For the simulation, the same structure as in FIG. 16 was simulated. The thickness of the silicon substrate 10 was set 40 µm, and the thickness of the respective interconnection layers was set at the same values as described above.

As shown in FIG. 17, the temperature difference Tmax depends on the distance between the transistor and the pad electrode 50. This means that the distance of the respective transistors arranged in the transistor array region 54 and the pad electrode 50 is made constant, whereby the temperature distribution in the transistor array region 54 can be made small.

In the semiconductor device according to the present embodiment, in the transistor array region 54, the respective transistors are arranged in one row with one ends of the gate electrodes 18 opposed to the pad electrode 50. The distance between the respective transistors formed in the transistor array 54 and the pad electrode 50 is constant. Thus, the temperature distribution in the transistor array region 54 can be made small.

As illustrated in FIG. 17, the temperature difference is substantially constant up to an about 10 μm-distance to the pad electrode 50 and when the distance to the bump is larger than 10 μm, increases as the distance increases. At this time, when the transistors have an 8 μm-gate width, the distance from the pad electrode 50 is substantially the same or below the gate width, whereby the heat radiation efficiency is improved, and the temperature can be sufficiently lowered.

In the semiconductor device according to the present embodiment, the gate line 48 alone is arranged between the transistor region 54 and the pad electrode 50, which allows the distance between the respective transistors and the pad electrode 50 to be set not more than 10 μm. Accordingly, the heat radiation from the pad electrode 50 can be improved.

The dependency of the heat radiation on the distance from the pad electrode as shown in FIG. 17 varies under the influence of the layer structure of the interconnection layers and the structure of the transistor. Preferably, that the distance of the transistor array region 54 and the pad electrode 50 is set by obtaining the same data as shown in FIG. 17 to set a distance which gives a prescribed heat radiation efficiency.

It is possible that as exemplified in FIG. 18, that the interconnection layer 36 is not formed below the region where the bump 56 is formed, and the pad electrode 50 is connected via the interconnection layer 36 from the periphery of the interconnection layer 38 (e.g., one side on the side of the source region 20). In this case, the heat radiation path to the bump 56 is from the interconnection layer 34 to the interconnection layer 38 via the interconnection layer 36 provided on the periphery of the interconnection layer 34. Accordingly, in the heat radiation efficiency, the structure of FIG. 18 is a little inferior to the structure of FIG. 14. Both of the structures of FIGS. 14 and 18 are effective as the damage measure when a stud bump is used as the bump 56.

FIG. 19 is a graph illustrating the result of the relationships between the heat radiation effect and the structure of the pad electrode below the bump 56 given by simulation. On the vertical axis, the temperature difference Tmax of the transistor array region 54 based on the bump 56, and on the horizontal axis, the number of the pad electrodes 50 provided for one transistor array region 54 is taken.

In the graph, the ♦ marked plots indicate the structure that, as illustrated in FIG. 20A, below the bump 56, the via of the interconnection layer 38, and the interconnection layer 36 are not arranged, and instead the inter-layer insulating film 24 is provided. The ■ marked plots indicate the structure that, as illustrated in FIG. 20B, below the bump 56, the via of the interconnection layer 38 and the via of the interconnection layer 36 are not provided, and instead the inter-layer insulating film 24 is provided. The ▲ marked plots indicate the structure that, as illustrated in FIG. 20C, the interconnection layer 38 and the interconnection layer 36 are provided below the bump 56.

As shown in FIG. 19, as a larger number of the pad electrodes 50 are provided for one transistor array region 54 and as the interconnection layers are provided below the bump in a larger ratio, the heat radiation efficiency can be improved.

As described above, according to the present embodiment, the distance between the transistors and the pad electrode can be shortened, and the distances of the respective transistors to the pad electrode can be made equal. Thus, the temperature distribution in the transistor array region can be made small. The efficiency of the heat radiation from the pad electrode can be improved.

[A Second Embodiment]

A semiconductor device according to a second embodiment will be described with reference to FIGS. 21 to 24. The same members of the present embodiment as those of the semiconductor device according to the first embodiment are represented by the same reference numbers not to repeat or to simplify their description.

Figure 21:
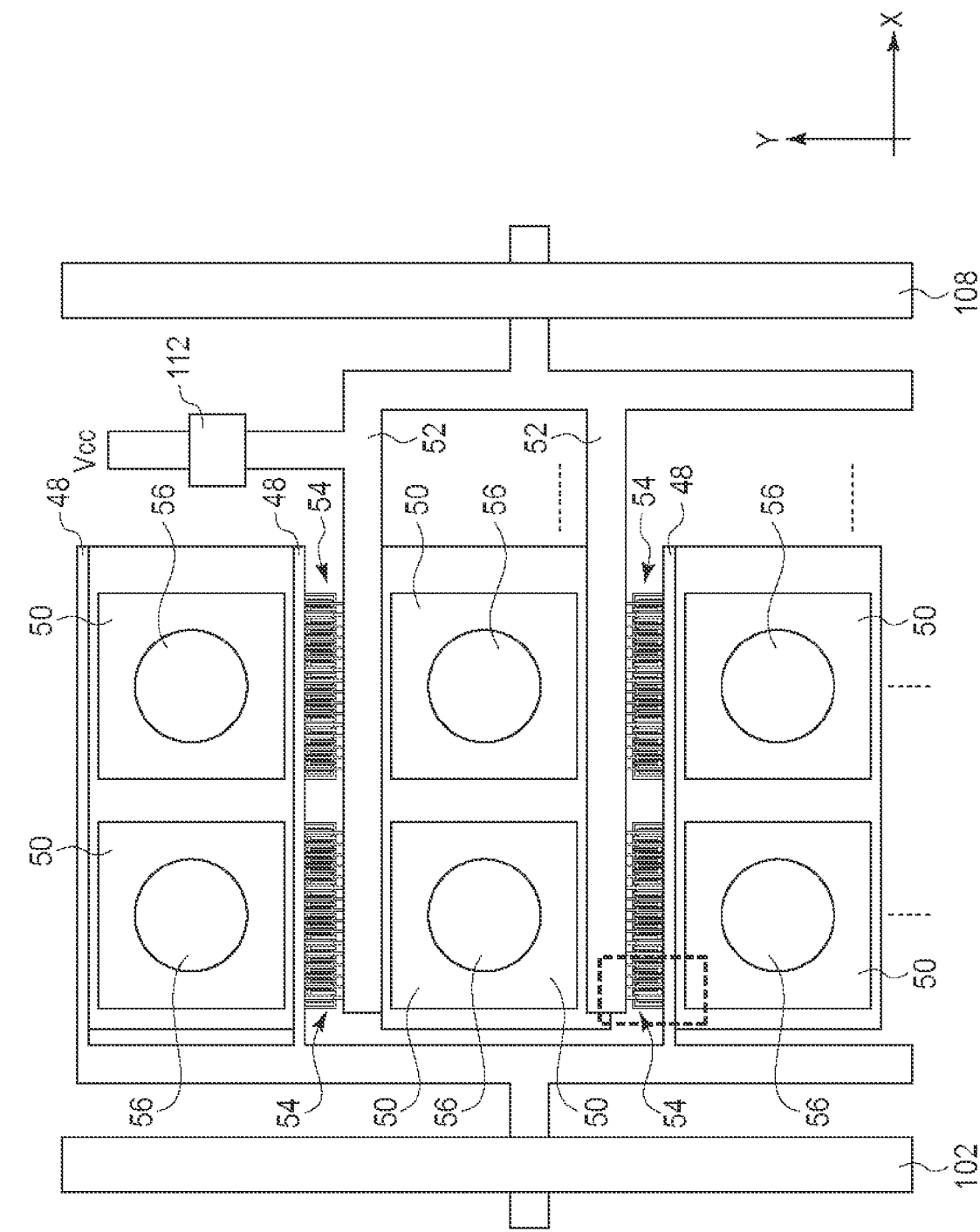
FIGS. 21 and 22 are plan views illustrating a structure of a semiconductor device according to a second embodiment.
Figure 22:
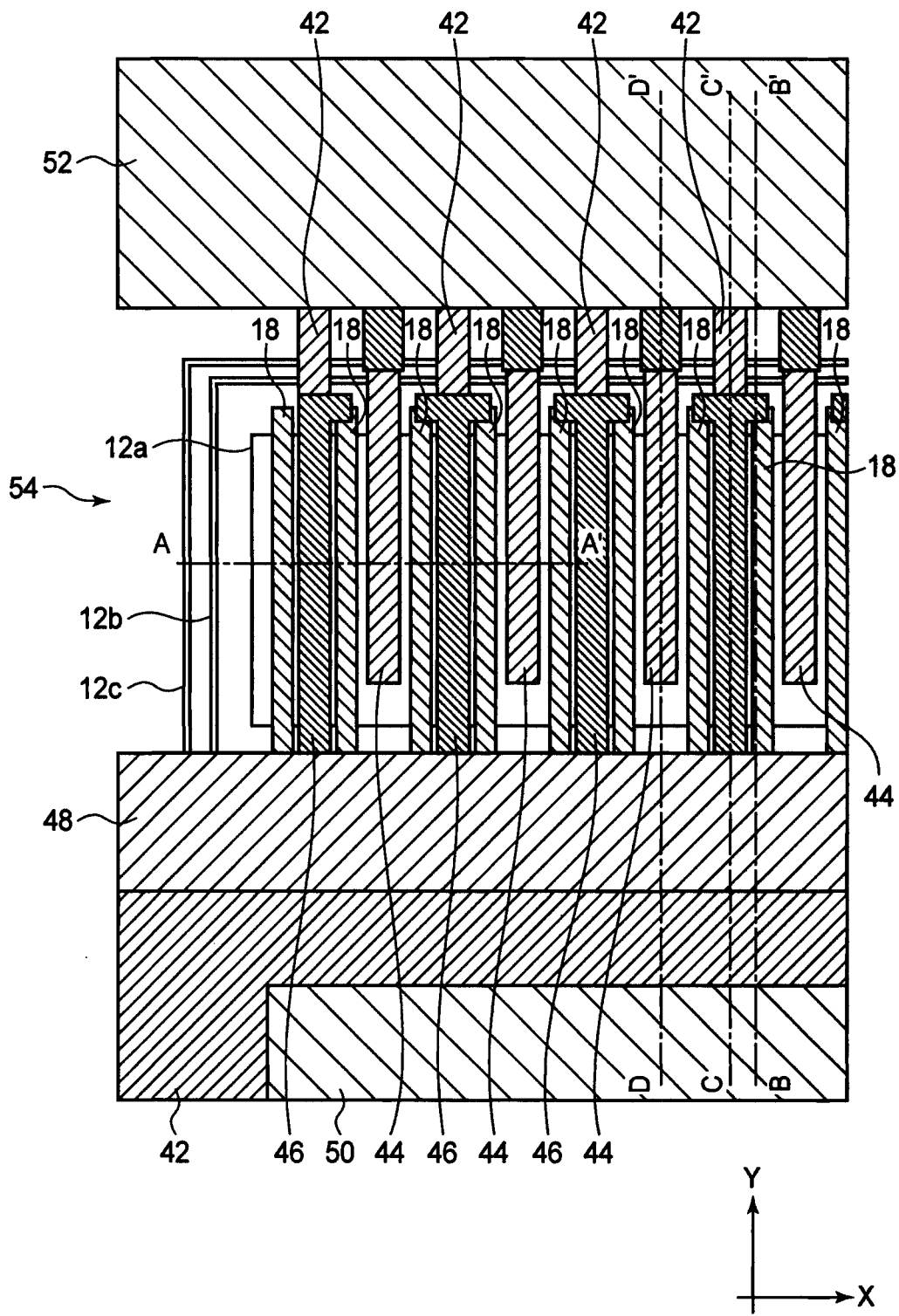
Figure 23:
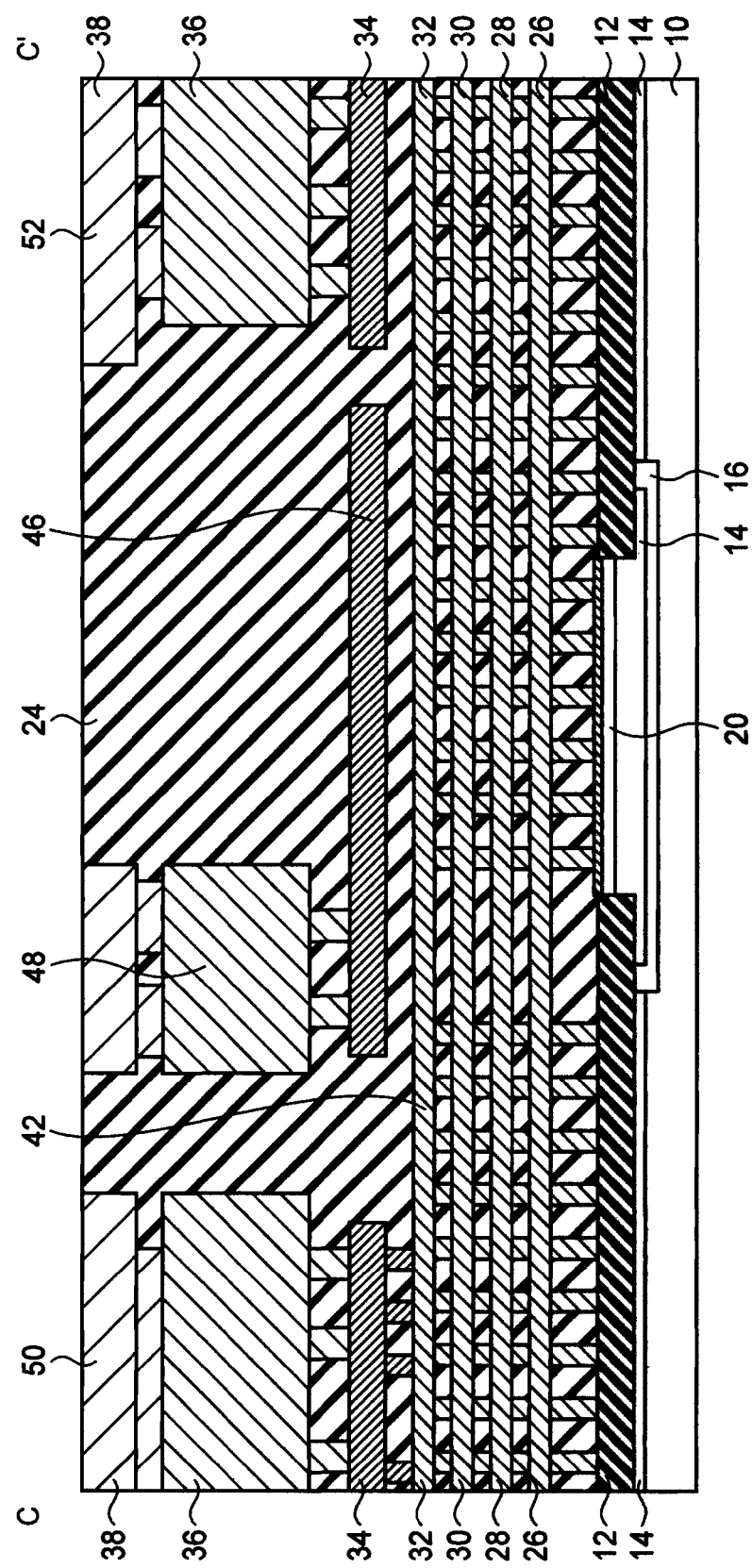

FIGS. 21 and 22 are plan views illustrating a structure of the semiconductor device according to the present embodiment. FIGS. 23 and 24 are diagrammatic sectional views illustrating the structure of the semiconductor device according to the present embodiment.

The semiconductor device according to the present embodiment is a semiconductor device including a high output transistor and is the same as the semiconductor device according to the first embodiment except that the transistor integrated unit 106 of the present embodiment is different from that of the first embodiment.

In the transistor integrated unit 106, as illustrated in FIG. 21, pad electrodes 50 are arranged in a matrix in the X direction and the Y direction.

In the regions between the pad electrodes 50 adjacent in the Y direction, gate lines 48 extended in the X direction and the drain lines 52 are respectively provided. In the regions between the respective gate lines 48 and the respective drain lines 42, the transistor array regions 54 are respectively provided corresponding to the respective pad electrodes 50.

The respective gate lines 48 are connected to the input matching circuit 102. In the example of FIG. 21, the plural gate lines 48 are gathered and connected to the input matching circuit 102.

The respective drain lines 52 are connected to the output matching circuit 108. In the example of FIG. 21, the plural drain lines are gathered and connected to the output matching circuit 108. The drain lines 52 are connected also to the Vcc terminal 114 via the high frequency choke circuit 112.

On the pad electrodes 50, connection electrodes, such as the bumps 56 or others, are formed. Thus, the semiconductor device is mounted on a circuit substrate via the bumps 56.

As described above, in the semiconductor device according to the present embodiment, a plurality of transistors of the transistor integrated unit 106 are sectioned and arranged in a plurality of the transistor array regions 54. The respective transistor array regions are arranged between the regions where the pad electrodes 50 functioning the heat radiation paths are formed.

FIG. 22 is an enlarged view of the area enclosed by the dotted line in FIG. 21. FIG. 23 is the sectional view along the C-C' line in FIG. 22. FIG. 24 is the sectional view along the D-D' line in FIG. 22. The sectional view along the A-A' line in FIG. 21 is the same as the A-A' line sectional view of the semiconductor device according to the first embodiment, which is illustrated in FIG. 5. The sectional view along the B-B' line in FIG. 21 is the same as the B-B' line sectional view of the semiconductor device according to the first embodiment, which is illustrated in FIG. 6.

In the silicon substrate 10, the device isolation insulating film 12 defining the active regions is formed. In the silicon substrate 10 of the transistor array region 54, the p-well 14, and the n-well 16 formed, enclosing the sides and the bottom of the p-well 14 are formed. In the region where the p-well 14 is formed, the active region 12a where the transistor array is formed is defined by the device isolation insulating film 12. In the peripheral region of the p-well 14, the active region 12b which is the lead-out region of the electrodes from the p-well 14 is defined by the device isolation insulating film 12. In the peripheral region of the n-well 16, the active region 12c which is the lead-out region of the electrodes from the n-well 16 is defined by the device isolation insulating film 12.

In the active region 12a, a plurality of gate electrodes 18 extended in the Y direction are provided. In the silicon substrate 10 on both sides of the respective gate electrodes 18, the source regions 16 and the drain regions 22 are respectively provided. The source regions 20 and the drain regions 22 are alternately provided in the active region 12a between the gate electrodes 18. The source regions 20 and the drain regions 22 of the transistors adjacent to each other are commonly used. Thus, in the active region 12a, the transistor array including plural transistors having the gate electrodes 18 extended in the Y direction are formed.

As described above, in the semiconductor device according to the present embodiment, in each transistor array region 54, a plurality of the transistors are arranged in one row with both ends of the gate electrodes 18 opposed to the pad electrodes 50 provided adjacent to each other with the transistor array region 54 provided therebetween. In other words, the pad electrodes 50 are arranged respectively in the extending direction of the gate electrodes 18 of the transistors or opposed to both sides of the gate width direction.

Above the silicon substrate 10 with the transistor arrays formed on, the inter-layer insulating film 24 is formed. In the inter-layer insulating film 24, a multilevel interconnection of a 7 level structure is buried in.

The first to the fourth level interconnection layers 26, 28, 30, 32 form the lead-out lines 40 from the gate electrodes 18, the lead-out lines 42 from the source regions 20 and the lead-out lines 44 from the drain regions 22 (see FIGS. 5, 23 and 24).

The lead-out lines 42 are used as one of the radiation paths toward the pad electrodes 50 from the transistors. To this end, the lead-out lines 42 are led out respectively from two sides of the transistor array region 54 opposed to the pad electrode 50 and are extended to the region where the pad electrode 50 is formed (see FIG. 23).

In the semiconductor device according to the present embodiment, two pad electrodes 50 are arranged, sandwiching one transistor array region 54 (see FIG. 21). The transistors are arranged with both ends of the gate electrodes 18 opposed to the side of the pad electrodes (see FIG. 22). This facilitates leading out the lead-out lines 42 from the source regions 20 toward the pad electrode 50.

The lead-out lines 42 are one of the important paths to transmit the heat generated from the transistors to the pad electrodes 50. Accordingly, it is preferable that the lead-out lines 42 are formed in regions as large as possible so as to reduce the heat resistance. In view of this, the lead-out lines 42 are formed preferably in the entire regions where the pad electrodes 50 are formed. The lead-out lines 42 are formed preferably enclosing the transistor array regions 54. As exemplified in FIG. 24, in the region where the drain lines 52 are provided, parts of the interconnection layers 26, 28, 30, 32 provided in the region where the drain lines 52 are provided, may be used as the lead-out line 42, and the other interconnection layers may be used as the lead-out lines 44.

The fifth level interconnection layer 34 form the strapping interconnections 46 of the gate electrodes connected to the lead-out lines 40. The strapping interconnections 46 are formed on the respective source regions 20, extended in the Y direction and are connected to both ends of two gate electrodes 18 positioned on both sides of the associated source regions 20 via the lead-out lines 40 (see FIGS. 6 and 23). The strapping interconnections 46 are provided for reducing the resistance of the gate electrodes 18.

The sixth level interconnection layer 36 and the seventh level interconnection layer 38 form the gate lines 48 connected to the strapping interconnections 46 (see FIGS. 23 and 24).

The fifth level interconnection layer 34, the sixth level interconnection layer 36 and the seventh level interconnection layer 38 form the pad electrodes 50 connected to the lead-out lines 42 and the drain lines 52 connected to the lead-out lines 44 (see FIGS. 5, 23 and 24).

As described above, in the semiconductor device according to the present embodiment, plural transistors in the transistor integrated unit 106 are sectioned and arranged in a plurality of the transistor array regions 54. The respective transistor array regions 54 are arranged adjacent to the regions where the pad electrodes functioning as the heat radiation paths. In each transistor array region 54, the plural transistors are arranged in one row with both ends of the gate electrodes 18 opposed to the pad electrode. This can shorten the distance between the transistors and the pad electrode 50 while the distance of the respective transistor to the pad electrode 50 can be made equal. Accordingly, the temperature distribution in the transistor array regions 54 can be made small. The heat radiation efficiency from the pad electrodes 50 can be improved.

In the semiconductor device according to the first embodiment, the pad electrode 50 is provided by substantially ½ for 1 transistor array region, while in the semiconductor device according to the present embodiment, 1 pad electrode 50 is substantially provided for 1 transistor array region 54. Accordingly, the semiconductor device according to the present embodiment can enhance the heat radiation efficient in comparison with the semiconductor device according to the first embodiment (see FIG. 19).

As described above, according to the present embodiment, the distance between the transistors and the pad electrodes can be made small while the distance of the respective transistors to the pad electrodes can be made equal. Thus, the temperature distribution in the transistor array regions can be made small. The heat radiation efficiency from the pad electrodes can be improved.

[Modified Embodiments]

The above-described embodiment can cover other various modifications.

For example, in the above-described embodiments, the semiconductor device includes the power amplifier circuit of the one-step structure and the two-step structure, but the circuit structure of the power amplifier circuit is not limited to them. The embodiments are applicable to not only semiconductor devices including the power amplifier circuit but also other semiconductor devices including transistors of large power consumption.

In the above-described embodiments, the semiconductor device includes the 7 interconnection layers, but the number of the interconnection layers is not limited to this. For example, the lower interconnection layers may be formed of 3 or less interconnection layers or 5 or more interconnection layers. The upper interconnection layers may be formed of 3 or more interconnection layers.

The modified examples described in the first embodiment may be applicable to the semiconductor device according to the second embodiment.

The structures, the constituent materials, the manufacturing conditions, etc. of the semiconductor device described in the above-described embodiments are only one example and can be suitably amended or modified in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
    a first transistor array including a plurality of transistors each having a gate electrode extended in a first direction, the plurality of transistors being arranged in a second direction intersecting the first direction;
    a first pad electrode arranged on a first side of the first transistor array in the first direction of the first transistor array and electrically connected to source regions of the plurality of transistors in the first transistor array;
    a drain line arranged on a second side of the first transistor array, which is different from the first side of the first transistor array, and electrically connected to drain regions of the plurality of transistors in the first transistor array and extended in the second direction;
    a first lead-out line formed from the drain regions of the plurality of transistors in the first transistor array to a region below the drain line and electrically connecting the drain regions of the plurality of transistors in the first transistor array to the drain line; and
    a third lead-out line formed from the source regions of the plurality of transistors in the first transistor array to the region below the pad electrode, and electrically connecting the source regions of the plurality of transistors in the first transistor array to the first pad electrode.

2. The semiconductor device according to claim 1, further comprising:
    a multilevel interconnection structure including
        a lower level interconnection layer including plural interconnection layers;
        a first upper level interconnection layer formed above the lower level interconnection layer;
        a second upper level interconnection layer formed above the first level upper interconnection layer and being thicker than the first upper level interconnection layer; and
        an uppermost level interconnection layer formed above the second upper level interconnection layer,
    wherein the first lead-out line is formed of the lower level interconnection layer.

3. The semiconductor device according to claim 1, further comprising:
    a second transistor array arranged in a line symmetry with the first transistor array with the drain line as a symmetry axis, including a plurality of transistors each having a gate electrode extended in the first direction, the plurality of transistors being arranged in the second direction; and
    a second pad electrode arranged in a line symmetry with the first pad electrode with the drain line as the symmetry axis and electrically connected to source regions of the plurality of transistors in the second transistor array.

4. The semiconductor device according to claim 1, further comprising:
    a second pad electrode arranged on a side of the drain line, which is different from a side of the drain line where the first transistor array is provided, and electrically connected to the source regions of the plurality of transistors in the first transistor array.

5. The semiconductor device according to claim 1, further comprising:
    a multilevel interconnection structure including
        a lower level interconnection layer including plural interconnection layers;
        a first upper level interconnection layer formed above the lower level interconnection layer;
        a second upper level interconnection layer formed above the first level upper interconnection layer and being thicker than the first upper level interconnection layer; and
        an uppermost level interconnection layer formed above the second upper level interconnection layer,
    wherein the drain line is formed of an interconnection structure including the second level interconnection layer and the uppermost level interconnection layer.

6. The semiconductor device according to claim 1, further comprising:
    a gate line arranged between the first transistor array and the first pad electrode, electrically connected to the gate electrodes of the plurality of transistors in the first transistor array, and extended in the second direction.

7. The semiconductor device according to claim 6, further comprising:
    a second lead-out line formed from the gate electrodes of the plurality of transistors in the first transistor array to a region below the gate line and electrically connecting the gate electrodes of the plurality of transistors in the first transistor array to the gate line.

8. The semiconductor device according to claim 7, further comprising:
    a multilevel interconnection structure including
        a lower level interconnection layer including plural interconnection layers;
        a first upper level interconnection layer formed above the lower level interconnection layer;
        a second upper level interconnection layer formed above the first level upper interconnection layer and being thicker than the first upper level interconnection layer; and
        an uppermost level interconnection layer formed above the second upper level interconnection layer,
    wherein the second lead-out line is formed of the lower level interconnection layer.

9. The semiconductor device according to claim 8, further comprising:
    strapping interconnections of the gate electrodes formed of the first upper level interconnection layer.

10. The semiconductor device according to claim 8, further comprising:
    a multilevel interconnection structure including
        a lower level interconnection layer including plural interconnection layers;
        a first upper level interconnection layer formed above the lower level interconnection layer;
        a second upper level interconnection layer formed above the first level upper interconnection layer and being thicker than the first upper level interconnection layer; and an uppermost level interconnection layer formed above the second upper level interconnection layer,
wherein the gate line is formed of an interconnection structure including the second level interconnection layer.

11. The semiconductor device according to claim 1, further comprising:
a multilevel interconnection structure including
a lower level interconnection layer including plural interconnection layers;
a first upper level interconnection layer formed above the lower level interconnection layer;
a second upper level interconnection layer formed above the first level upper interconnection layer and being thicker than the first upper level interconnection layer; and
an uppermost level interconnection layer formed above the second upper level interconnection layer,
wherein the third lead-out line is formed of the lower level interconnection layer.

12. The semiconductor device according to claim 1, further comprising:
a multilevel interconnection structure including
a lower level interconnection layer including plural interconnection layers;
a first upper level interconnection layer formed above the lower level interconnection layer;
a second upper level interconnection layer formed above the first level upper interconnection layer and being thicker than the first upper level interconnection layer; and
an uppermost level interconnection layer formed above the second upper level interconnection layer,
wherein the first pad electrode is formed of an interconnection structure including the uppermost level interconnection layer.

13. The semiconductor device according to claim 1, wherein
the plurality of transistors in the first transistor array are arrange in one row in the second direction.

14. The semiconductor device according to claim 1, wherein
a width of the first transistor array is equal to a width of the first pad electrode.

15. The semiconductor device according to claim 1, further comprising:
a gate line arranged between the first transistor array and the first pad electrode, electrically connected to the first gate electrodes of the plurality of transistors, extended in the second direction, and located above the third lead-out line.

16. A semiconductor device comprising:
a plurality of pad electrodes arranged in a matrix in a first direction and a second direction intersecting the first direction;
a plurality of transistor arrays arranged respectively in the first direction of the plurality of pad electrodes and including a plurality of transistors each including a gate electrode extended in the first direction and a source region electrically connected to the adjacent pad electrode, the plurality of transistors being arranged in the second direction, the plurality of pad electrodes being located on a first side of the plurality of transistor arrays respectively;
a plurality of drain lines respectively arranged on a second side of the plurality of transistor arrays, which is different from the first side of the plurality of transistor arrays, and electrically connected to drain regions of the plurality of transistors in the plurality of transistor arrays and extended in the second direction;
a plurality of first lead-out lines respectively formed from the drain regions of the plurality of transistors in the plurality of transistor arrays to a region below the drain line and electrically connecting the drain regions of the plurality of transistors in the plurality of transistor arrays to the drain line; and
a plurality of third lead-out lines respectively formed from the source regions of the plurality of transistors in the plurality of transistor arrays to the region below the pad electrodes, and respectively electrically connecting the source regions of the plurality of transistors in the plurality of transistor arrays to the plurality of pad electrodes located on the first side of the plurality of transistor arrays.

17. The semiconductor device according to claim 16, further comprising:
a plurality of gate lines respectively arranged between the transistor arrays and the pad electrodes, respectively electrically connected to the gate electrodes of the plurality of transistors, extended in the second direction, and located above the plurality of third lead-out lines.

18. A semiconductor device comprising:
a transistor array including a plurality of transistors each having a gate electrode extended in a first direction, the plurality of transistors being arranged in a second direction intersecting the first direction;
a pad electrode arranged on a first side of the transistor array in the first direction of the transistor array and electrically connected to source regions of the plurality of transistors;
a drain line arranged on a second side of the transistor array, which is different from the first side of the transistor array, and electrically connected to drain regions of the plurality of transistors and extended in the second direction;
a first lead-out line formed from the drain regions of the plurality of transistors in the transistor array to a region below the drain line and electrically connecting the drain regions of the plurality of transistors in the transistor array to the drain line;
a third lead-out line formed from the source regions of the plurality of transistors in the transistor array to the region below the pad electrode, and electrically connecting the source regions of the plurality of transistors in the transistor array to the pad electrode;
a gate line arranged between the transistor array and the pad electrode, electrically connected to the gate electrodes of the plurality of transistors, and extended in the second direction;
an input matching circuit connected to the gate line; and
an output matching circuit connected to the drain line.

19. The semiconductor device according to claim 18, wherein the gate line is located above the third lead-out line.

* * * * *